(12) United States Patent
Ikeda et al.

(10) Patent No.: US 7,402,936 B2
(45) Date of Patent: Jul. 22, 2008

(54) PIEZOELECTRIC/ELECTROSTRICTIVE DEVICE

(75) Inventors: Koji Ikeda, Tsu (JP); Yuya Kikuta, Nagoya (JP); Nobuchika Noguchi, Ichinomiya (JP); Kazumasa Kitamura, Ichinomiya (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/738,753

(22) Filed: Apr. 23, 2007

(65) Prior Publication Data

US 2007/0188052 A1 Aug. 16, 2007

Related U.S. Application Data

(63) Continuation of application No. PCT/JP2005/019443, filed on Oct. 17, 2005.

(30) Foreign Application Priority Data

| Oct. 25, 2004 | (JP) | ............................. 2004-310023 |
| Dec. 10, 2004 | (JP) | ............................. 2004-358874 |
| Jan. 17, 2005 | (JP) | ............................. 2005-008505 |
| Mar. 17, 2005 | (JP) | ............................. 2005-077383 |

(51) Int. Cl.
*H01L 41/08* (2006.01)

(52) U.S. Cl. ...................................... 310/328; 310/332

(58) Field of Classification Search ................. 310/324, 310/328, 330–332
See application file for complete search history.

(56) References Cited

U.S. PATENT DOCUMENTS 5,281,899 A * 1/1994 Culp .......................... 318/116

| 7,071,599 | B2 * | 7/2006 | Namerikawa et al. ........ 310/366 |
| 2002/0017830 | A1 | 2/2002 | Ikeda et al. |
| 2003/0234595 | A1 * | 12/2003 | Takahashi et al. ........... 310/324 |
| 2004/0185278 | A1 | 9/2004 | Sato |
| 2005/0248235 | A1 * | 11/2005 | Namerikawa et al. ........ 310/328 |
| 2006/0207078 | A1 * | 9/2006 | Namerikawa et al. ...... 29/25.35 |

FOREIGN PATENT DOCUMENTS

| JP | 06-252469 A1 | 9/1994 |
| JP | 2000-082931 A1 | 3/2000 |
| JP | 2001-320103 A1 | 11/2001 |
| JP | 2002-117637 A1 | 4/2002 |
| JP | 2002-299713 A1 | 10/2002 |
| JP | 2003-047923 A1 | 2/2003 |
| JP | 2004-137106 A1 | 5/2004 |
| JP | 2004-282053 A1 | 10/2004 |

\* cited by examiner

*Primary Examiner*—Thomas M Dougherty
(74) *Attorney, Agent, or Firm*—Burr & Brown

(57) ABSTRACT

A piezoelectric/electrostrictive device is provided with a stationary portion, a thin-plate portion supported by the stationary portion, and piezoelectric/electrostrictive element formed by alternately laminating a plurality of electrodes and a plurality of piezoelectric/electrostrictive layers. The piezoelectric/electrostrictive device is produced by cutting a thin-plate body that composes the thin-plate portion afterward and a laminated body comprising the piezoelectric/electrostrictive layers and thereafter applying prescribed specific processing (for example, heat treatment) to the cut plane (the lateral end surfaces). By so doing, the ratio of the actual surface area of the lateral end surface of the piezoelectric/electrostrictive element to the area of the lateral end surface of the piezoelectric/electrostrictive element in the orthographic projection is four or less, and the deposition of moisture on the lateral end surfaces is suppressed to the extent of not substantially generating electric leakage or ion migration. As a result, a highly durable piezoelectric/electrostrictive device can be provided.

3 Claims, 11 Drawing Sheets

PIEZOELECTRIC/ELECTROSTRICTIVE DEVICE

TECHNICAL FIELD

The present invention relates to a piezoelectric/electrostrictive device including a stationary portion, a thin-plate portion supported by the stationary portion, and a piezoelectric/electrostrictive element including laminar electrodes and a piezoelectric/electrostrictive layer.

BACKGROUND ART

Piezoelectric/electrostrictive devices of the above-described type have been actively developed as an actuator for precision machining; as an actuator for controlling the position of a read and/or write element (e.g., a magnetic head of a hard disk drive) for reading and/or writing optical information, magnetic information, or the like; as a sensor for converting mechanical vibration to an electrical signal; or as a similar device.

Japanese Patent Application Laid-Open (kokai) No. 2001-320103 discloses an example of such a piezoelectric/electrostrictive device, which is shown in FIG. 13. The piezoelectric/electrostrictive device includes a stationary portion 100; thin-plate portions 110 supported by the stationary portion 100; holding portions (movable portions) 120 provided at corresponding tip ends of the thin-plate portions 110 and adapted to hold an object (e.g., a magnetic head of a hard disk drive); and piezoelectric/electrostrictive elements 130 formed at least on corresponding surfaces of the thin-plate portions 110, each piezoelectric/electrostrictive element 130 including a plurality of electrodes and a plurality of piezoelectric/electrostrictive layers which are laminated alternately. In the piezoelectric/electrostrictive device, an electric field is generated between electrodes of the piezoelectric/electrostrictive elements 130 to thereby expand and contract the piezoelectric/electrostrictive layers of the piezoelectric/electrostrictive elements 130, whereby the thin-plate portions 110 are deformed. The deformation of the thin-plate portions 110 causes displacement of the holding portions 120 (accordingly, displacement of the object held by the holding portions 120).

The piezoelectric/electrostrictive device of FIG. 13 is manufactured as follows. Firstly, as shown in FIG. 14, a plurality of ceramic green sheets (and/or a ceramic green sheet laminate) are prepared. As shown in FIG. 15, these ceramic green sheets are laminated together and then fired, thereby forming a ceramic laminate 200. As shown in FIG. 16, piezoelectric/electrostrictive laminates 210, each including a plurality of electrodes and a plurality of piezoelectric/electrostrictive layers which are laminated alternately, are formed on the surface of the ceramic laminate 200. Through wire sawing (or, for example, dicing) by use of a wire saw WS, the piezoelectric/electrostrictive laminates 210 are cut along cutting lines C1 to C4 shown in FIG. 17, thereby yielding the piezoelectric/electrostrictive device.

Meanwhile, in the case where the above-disclosed piezoelectric/electrostrictive device is actually used (for example, in the case where the device is used as an actuator for the positioning of the magnetic head of a hard disk drive), moisture may sometimes deposit on lateral end surfaces (cut planes along the cutting line C3 or C4 in FIG. 17) of piezoelectric/electrostrictive elements 130. Such moisture can be caused by, for example, condensation or the like of water vapor in an atmosphere (in the air).

When moisture deposits on lateral end surfaces of piezoelectric/electrostrictive elements 130 (particularly on lateral end surfaces of piezoelectric/electrostrictive layers as parts of lateral end surfaces of piezoelectric/electrostrictive elements 130), the electric resistance of the piezoelectric/electrostrictive layers on the lateral end surfaces of which moisture has deposited lowers and thereby electric leakage tends to occur between the electrodes on both the sides that interpose the respective piezoelectric/electrostrictive layers. Otherwise, so-called ion migration is promoted on the lateral end surfaces of the piezoelectric/electrostrictive layers due to the existence of the moisture that deposits on the lateral end surfaces and, as a result, short circuit tends to occur between the electrodes on both the sides that interpose the respective piezoelectric/electrostrictive layers on the lateral end surfaces of which the moisture has deposited.

When such electric leakage occurs, voltage between the electrodes lowers and thereby the strength of the electric field formed between the electrodes weakens. As a result, the amount of the expansion and contraction of the piezoelectric/electrostrictive layers reduces and the piezoelectric/electrostrictive elements 130 (namely the piezoelectric/electrostrictive device) cannot attain intended operations. Further, when such short circuit occurs, voltage is not generated between the electrodes, thereby the piezoelectric/electrostrictive elements 130 do not expand or contract, and as a result the piezoelectric/electrostrictive elements 130 (namely the piezoelectric/electrostrictive device) cannot operate.

In addition, when such an above-disclosed piezoelectric/electrostrictive device is used as, for example, an actuator for the positioning of the magnetic head of a hard disk drive, the attachment of debris, dust, or the like on a hard disk, etc., may cause incorrect reading/writing of information. Hence, the piezoelectric/electrostrictive device is to be placed in an environment where the generation of debris, dust, or the like (the generation of debris, dust, or the like may hereunder be referred to as "dust generation" occasionally) can be suppressed to a lowest possible level.

In such a case, the above-disclosed piezoelectric/electrostrictive device is used in the state where the lateral end surfaces (cut planes along the cutting line C3 or C4 in FIG. 17), constituting a single planar plane, of the device face the surface of the hard disk with a relatively small gap in between and hence it is particularly necessary to prevent dust generation caused by the separation of microparticles (the separation of microparticles may hereunder be referred to as "particle separation" occasionally) from the lateral end surfaces (cut planes along the cutting line C3 or C4 in FIG. 17) of the constituent elements constituting the lateral end surfaces of the piezoelectric/electrostrictive device. From the above viewpoint, test items related to dust generation have been added to such a piezoelectric/electrostrictive device in recent years.

In view of the above situation, the above-disclosed piezoelectric/electrostrictive device is required to effectively suppress the deposition of moisture on the lateral end surfaces of piezoelectric/electrostrictive elements 130 and dust generation from the lateral end surfaces when the piezoelectric/electrostrictive device is actually used.

DISCLOSURE OF THE INVENTION

In view of the above situation, an object of the present invention is to provide a piezoelectric/electrostrictive device which can effectively suppress the deposition of moisture on the lateral end surfaces of piezoelectric/electrostrictive elements and dust generation from the lateral end surfaces.

In order to attain the above object, the present invention provides a piezoelectric/electrostrictive device comprising: thin-plate portions; a stationary portion that supports the thin-plate portions; and piezoelectric/electrostrictive elements each of which is formed by laminating a plurality of electrodes and at least one piezoelectric/electrostrictive layer at least on a plane of each of the thin-plate portions and has lateral end surfaces formed with the respective lateral end surfaces of the plurality of electrodes and the lateral end surfaces of the at least one piezoelectric/electrostrictive layer, wherein the ratio of the actual surface area of the lateral end surfaces of the piezoelectric/electrostrictive elements to the area of the lateral end surfaces of the piezoelectric/electrostrictive elements in the orthographic projection is four or less.

In general, when moisture deposits on a surface, the moisture tends to hardly deposit as the actual surface area of the surface (namely, the total surface area obtained by three-dimensionally taking all the large and small bumps and dips on the surface into consideration) reduces. Hence, it can be said that moisture tends to hardly deposit on the lateral end surfaces of a piezoelectric/electrostrictive element as the actual surface area of the lateral end surfaces reduces.

Further, the reduction of the actual surface area of the lateral end surfaces of a piezoelectric/electrostrictive element leads to the reduction of the ratio of the actual surface area of the lateral end surfaces of the piezoelectric/electrostrictive element to the area of the lateral end surfaces of the piezoelectric/electrostrictive element in the orthographic projection (hereunder referred to as "surface area increase rate").

Here, the present inventors have found that, when such a piezoelectric/electrostrictive device is actually used under ordinary service conditions, the deposition of moisture to the lateral end surfaces of the piezoelectric/electrostrictive device is suppressed to the extent of not substantially generating the aforementioned electric leakage and ion migration as long as the surface area increase rate of the lateral end surfaces of the piezoelectric/electrostrictive elements is "four" or less.

In addition, the present inventors have found that the actual surface area (namely, surface area increase rate) of the lateral end surfaces of a piezoelectric/electrostrictive element strongly correlates with the extent of the particle separation from the lateral end surfaces and the particle separation (namely, dust generation) from the lateral end surfaces can effectively be suppressed as long as the surface area increase rate is "four" or less.

Hence, by the above configuration, it is possible to effectively suppress the deposition of moisture onto the lateral end surfaces of a piezoelectric/electrostrictive element and dust generation from the lateral end surfaces. As a result, the intended operation of the piezoelectric/electrostrictive device is maintained for a long period of time. In other words, it is possible to provide a highly-durable piezoelectric/electrostrictive device. In addition, it is possible to provide a piezoelectric/electrostrictive device which can be used in an environment where dust generation should be avoided to the utmost.

In general, when the lateral end surfaces of a piezoelectric/electrostrictive element is formed (finished) by only machining or the like such as wire sawing, dicing, or the like, the surface area increase rate of the lateral end surfaces of the piezoelectric/electrostrictive element is larger than "four." in order to provide a piezoelectric/electrostrictive device according to the present invention, therefore, the production method including, in addition to the process of cutting the laminated body comprising electrodes and piezoelectric/electrostrictive layers, the process of forming (finishing) the lateral end surfaces of a piezoelectric/electrostrictive element so that the prescribed specific processing may be applied to the cut planes formed by the cutting and thereby the surface area increase rate of the lateral end surfaces may be four or less is actually adopted.

That is, the present invention, by such a production method, can provide a piezoelectric/electrostrictive device, wherein the lateral end surfaces of piezoelectric/electrostrictive elements are formed by applying prescribed specific processing to cut planes formed by cutting the laminated body comprising electrodes and piezoelectric/electrostrictive layers.

The specific processing is preferably any one of the processing of applying YAG laser processing to the cut planes, the processing of applying excimer laser processing to the cut planes, the processing of applying blasting to the cut planes, the processing of applying ultrasonic cleaning to the cut planes, the processing of applying heating to the cut planes in a furnace (namely, heat treatment), and the processing of applying polishing to the cut planes (or an arbitrary combination of two or more kinds of the processing).

By adopting any one of the above processing (or a combination of two or more kinds of the processing) as the above specific processing, it is possible to surely control the surface area increase rate of the lateral end surfaces of a piezoelectric/electrostrictive element to "four" or less through relatively simple treatment.

BEST MODE FOR CARRYING OUT THE INVENTION

Figure 1:
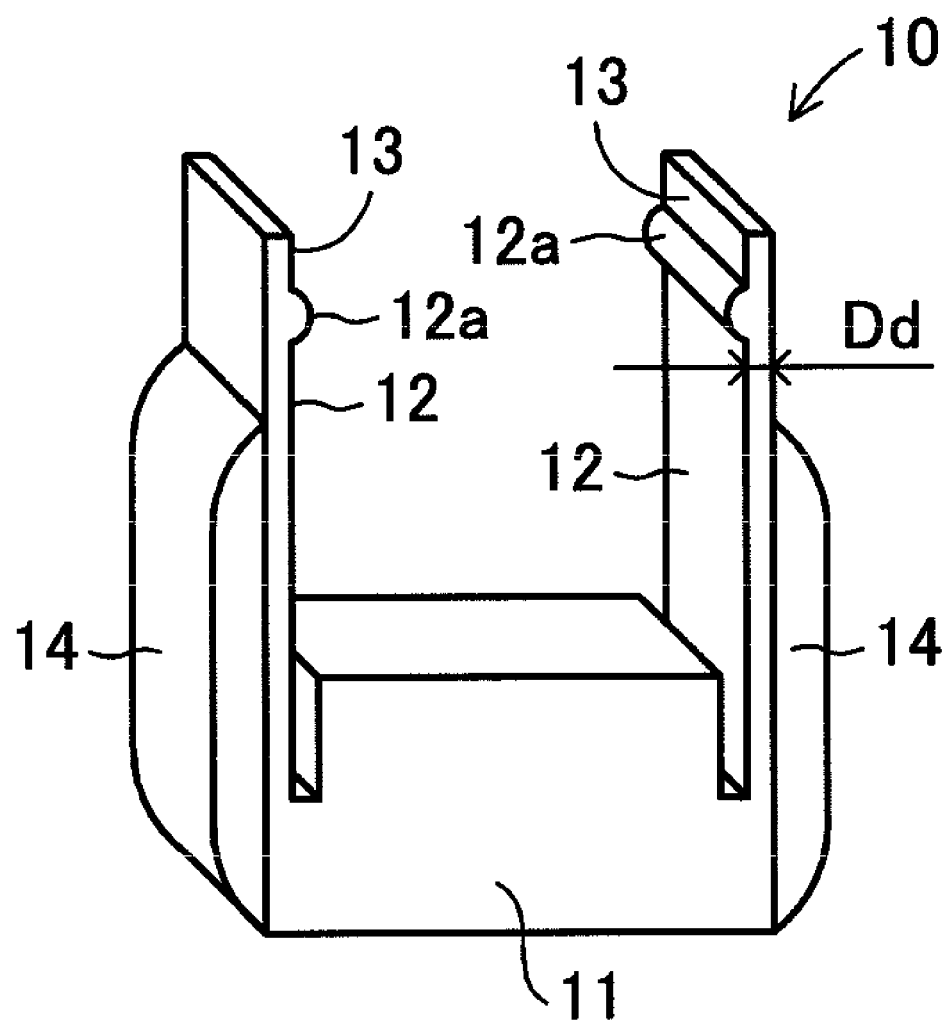
FIG. 1 is a perspective view showing a piezoelectric/electrostrictive device according to an embodiment of the present invention.

Embodiments of piezoelectric/electrostrictive devices according to the present invention are hereunder explained in reference to drawings. A piezoelectric/electrostrictive device 10 according to the present embodiment shown as a perspective view in FIG. 1 comprises: a stationary portion 11 of a rectangular solid; a pair of thin-plate portions 12 being supported with the stationary portion 11 so as to stand from the stationary portion and facing each other; holding portions (movable portions) 13 formed at the insides on the tip side from the protrusions 12a formed at the insides in the vicinities of the tips of the thin-plate portions 12; and piezoelectric/electrostrictive elements 14 formed at least on respective outer planes of the thin-plate portions 12 by alternately laminating laminar electrodes and piezoelectric/electrostrictive layers. The outline of such a configuration is disclosed in, for example, Japanese Patent Application Laid-Open (kokai) No. 2001-320103.

The piezoelectric/electrostrictive device 10 retains an object (not shown in the figure), for example, by adhering the object between the pair of the holding portions 13 with an adhesive, deforms the thin-plate portions 12 by the force generated by the piezoelectric/electrostrictive elements 14, thereby displaces the holding portions 13, and thereby can be used as an actuator to be able to control the position of the object. That is, the protrusions 12a have the function of regulating the region where the adhesive is used. The object is a magnetic head, an optical head, a weight for gain control as a sensor, or the like.

A portion (also generically called a "substrate portion") constituted by the stationary portion 11, the thin-plate portions 12, and the holding portions 13 is formed of a ceramic laminate, which is formed by firing a laminate of ceramic green sheets as will be described below in detail. Such a monolithic ceramic element does not employ an adhesive for joining its portions and is thus almost free from a change in state with passage of time, thereby providing a highly reliable joint and having advantage in terms of attainment of rigidity.

The ceramic laminate can be readily manufactured by a ceramic green sheet lamination process, which will be described below.

The entirety of the substrate portion may be formed from a ceramic material or a metal, or may assume a hybrid structure in which a ceramic material and a metal are employed in combination. Also, the substrate portion may be configured such that ceramic pieces are bonded together by means of an adhesive, such as an organic resin or glass, or such that metallic pieces are joined together through brazing, soldering, eutectic bonding, diffusion joining, welding, or a similar technique.

Figure 2:
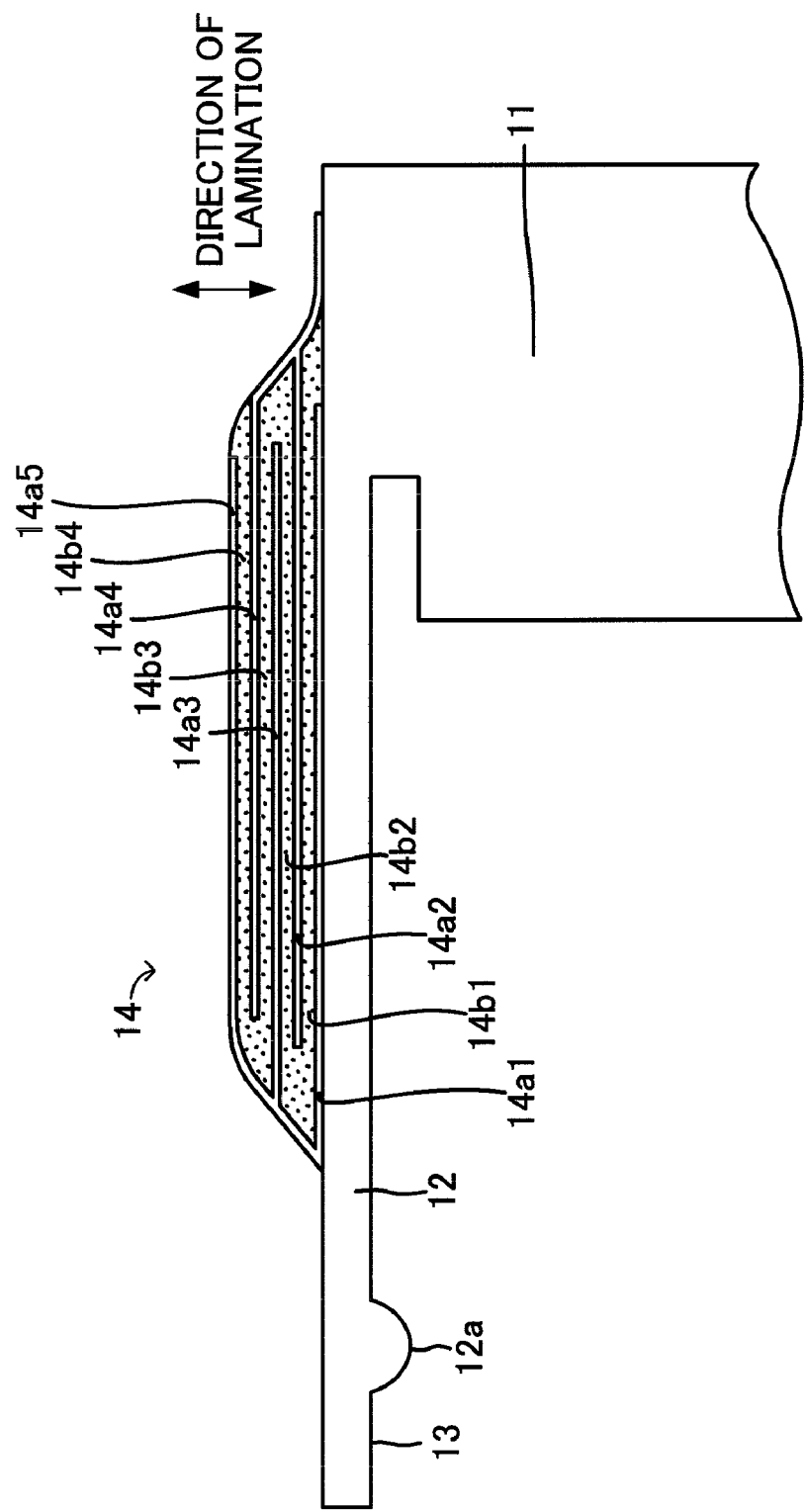
FIG. 2 is an enlarged fragmental front view showing the piezoelectric/electrostrictive device of FIG. 1.

As shown in the enlarged view of FIG. 2, the piezoelectric/electrostrictive element 14 is formed on an outer wall surface (outer surface) formed by the stationary portion 11 (or a portion of the stationary portion) and the thin-plate portion 12 (or a portion of the thin-plate portion), includes a plurality of laminar electrodes and a plurality of piezoelectric/electrostrictive layers, and assumes the form of a laminate in which the laminar electrodes and the piezoelectric/electrostrictive layers are laminated alternately. The electrode layers and the piezoelectric/electrostrictive layers are parallel to the surface of the thin-plate portion 12. More specifically, the piezoelectric/electrostrictive element 14 is a laminate in which an electrode 14a1, a piezoelectric/electrostrictive layer 14b1, an electrode 14a2, a piezoelectric/electrostrictive layer 14b2, an electrode 14a3, a piezoelectric/electrostrictive layer 14b3, an electrode 14a4, a piezoelectric/electrostrictive layer 14b4, and an electrode 14a5 are laminated in that order on the outer surface of the thin-plate portion 12. The electrodes 14a1, 14a3, and 14a5 are electrically connected together and are insulated from the electrically connected electrodes 14a2 and 14a4. In other words, the electrically connected electrodes 14a1, 14a3, and 14a5 and the electrically connected electrodes 14a2 and 14a4 are arranged in a shape resembling the teeth of a comb.

The piezoelectric/electrostrictive element 14 is formed integrally with the substrate portion by a film formation process, which will be described below. Alternatively, the piezoelectric/electrostrictive element 14 may be manufactured separately from the substrate portion, followed by a process of joining the piezoelectric/electrostrictive element 14 to the substrate portion by use of an adhesive, such as an organic resin, or by means of glass, brazing, soldering, eutectic bonding, or a similar technique.

The present embodiment shows a multi-layered structure including five electrode layers; however, no particular limitation is imposed on the number of layers. In general, as the number of layers increases, a force (drive force) for deforming the thin-plate portions 12 increases, but power consumption also increases. Accordingly, the number of layers can be appropriately determined in accordance with, for example, application and the state of use.

A supplementary description of component elements of the piezoelectric/electrostrictive device 10 will next be given below.

The holding portions 13 operate on the basis of displacement of the thin-plate portions 12. Various members are attached to the holding portions 13 in accordance with applications of the piezoelectric/electrostrictive device 10. For example, when the piezoelectric/electrostrictive device 10 is employed as an element (displacing element) for displacing an object, particularly when the piezoelectric/electrostrictive 10 is employed for positioning or suppressing wringing of a magnetic head of a hard disk drive, a slider having a magnetic head, a magnetic head, a suspension having a slider, or a similar member (i.e., a member required to be positioned) may be attached. Also, the shield of an optical shutter or the like may be attached.

As described above, the stationary portion 11 is adapted to support the thin-plate portions 12 and the holding portions 13. When the piezoelectric/electrostrictive device 10 is employed for, for example, positioning the magnetic head of a hard disk drive, the stationary portion 11 is fixedly attached to a carriage arm attached to a VCM (voice coil motor), to a fixture plate attached to the carriage arm, to a suspension, or to a similar member. In some cases, unillustrated terminals and other members for driving the piezoelectric/electrostrictive elements 14 are provided on the stationary portion 11. The terminals may have a width similar to that of the electrodes or may be narrower or partially narrower than the electrodes. No particular limitation is imposed on the material for forming the holding portions 13 and the stationary portion 11, so long as the holding portions 13 and the stationary portion 11 have rigidity. In general, employment of a ceramic material as the material for these portions is preferred, since a ceramic green sheet lamination process, which will be described below, can be applied. Specific examples of the material include a material containing, as a primary component, zirconia (such as stabilized zirconia or partially stabilized zirconia), alumina, magnesia, silicon nitride, aluminum nitride, or titanium oxide; and a material containing a mixture of them as a primary component. A material containing, as a primary component, zirconia (in particular, stabilized zirconia or partially stabilized zirconia) is preferred for the piezoelectric/electrostrictive device 10, since such a material has high mechanical strength and toughness. When a metallic material is to be employed for manufacturing the holding portions 13 and the stationary portion 11, stainless steel, nickel, or the like is preferred as the metallic material.

As described above, the thin-plate portions 12 are driven by the piezoelectric/electrostrictive elements 14. The thin-plate portions 12 are thin-plate-like members having flexibility and have a function for converting expansion/contraction displacement of the piezoelectric/electrostrictive elements 14 disposed on their surfaces to bending displacement and transmitting the bending displacement to the corresponding holding portions 13. Accordingly, no particular limitation is imposed on the shape of and the material for the thin-plate portions 12, so long as the thin-plate portions 12 are flexible and have such mechanical strength as not to be broken from bending deformation; and the shape and material are selected in view of, for example, response and operability of the holding portions 13.

The thickness Dd (see FIG. 1) of the thin-plate portion 12 is preferably about 2 μm to about 100 μm; and the total thickness of the thin-plate portion 12 and the piezoelectric/electrostrictive element 14 is preferably 7 μm to 500 μm. The thickness of each of the electrodes 14a1 to 14a5 is preferably 0.1 μm to 50 μm; and the thickness of each of the piezoelectric/electrostrictive layers 14b1 to 14b5 is preferably 3 μm to 300 μm.

Preferably, as in the case of the holding portions 13 and the stationary portion 11, a ceramic material is employed for forming the thin-plate portions 12. Among ceramic materials, a material containing, as a primary component, zirconia (in particular, stabilized zirconia or partially stabilized zirconia) is more preferred, since such a material exhibits, even when having a small thickness, high mechanical strength and high toughness, and it has low reactivity with the electrode material of the electrodes 14a1 and the piezoelectric/electrostrictive layers 14b1, which constitute the piezoelectric/electrostrictive element 14.

The thin-plate portions 12 can also be formed from a metallic material that has flexibility and allows bending deformation. Among preferred metallic materials for the thin-plate portions 12, examples of ferrous materials include stainless steels and spring steels, and examples of nonferrous materials include beryllium copper, phosphor bronze, nickel, and nickel-iron alloys.

Preferably, stabilized zirconia or partially stabilized zirconia to be employed in the piezoelectric/electrostrictive device 10 is stabilized or partially stabilized in the following manner. At least one compound, or two or more compounds selected from among yttrium oxide, ytterbium oxide, cerium oxide, calcium oxide, and magnesium oxide are added to zirconia to thereby stabilize or partially stabilize the zirconia.

Each of the compounds is added in the following amount: in the case of yttrium oxide or ytterbium oxide, 1 to 30 mol %, preferably 1.5 to 10 mol %; in the case of cerium oxide, 6 to 50 mol %, preferably 8 to 20 mol %; and in the case of calcium oxide or magnesium oxide, 5 to 40 mol %, preferably 5 to 20 mol %. Particularly, employment of yttrium oxide as a stabilizer is preferred. In this case, preferably, yttrium oxide is added in an amount of 1.5 to 10 mol % (more preferably, 2 to 4 mol % when mechanical strength is regarded as particularly important, or 5 to 7 mol % when endurance reliability is regarded as particularly important).

Alumina, silica, a transition metal oxide, or the like can be added to zirconia as a sintering aid or the like in an amount of 0.05 to 20 wt %. In the case where the piezoelectric/electrostrictive elements 14 are formed through film formation and monolithic firing, addition of alumina, magnesia, a transition metal oxide, or the like is preferred.

In the case where at least one of the stationary portion 11, the thin-plate portion 12, and the holding portion 13 is formed from a ceramic material, in order to obtain a ceramic material having a high mechanical strength and stable crystal phase, the average crystal grain size of zirconia is preferably regulated to 0.05 to 3 μm, more preferably 0.05 to 1 μm. As described above, the thin-plate portions 12 may be formed from a ceramic material similar to (but different from) that employed to form the holding portions 13 and the stationary portion 11. However, preferably, the thin-plate portions 12 are formed from a material substantially identical to that of the holding portions 13 and the stationary portion 11 in view of enhancement of the reliability of joint portions, enhancement of the strength of the piezoelectric/electrostrictive device 10, and simplification of a procedure for manufacturing the piezoelectric/electrostrictive device 10.

A piezoelectric/electrostrictive device can employ a piezoelectric/electrostrictive element of a unimorph type, a bimorph type, or the like. However, the unimorph type, in which the thin-plate portions 12 and corresponding piezoelectric/electrostrictive elements are combined together, is advantageous in terms of stability of displacement quantity, a reduction in weight, and easy design for avoiding occurrence of opposite orientations between stress generated in the piezoelectric/electrostrictive element and strain associated with deformation of the piezoelectric/electrostrictive device. Therefore, the unimorph type is suitable for the piezoelectric/electrostrictive device 10.

When, as shown in FIG. 1, the piezoelectric/electrostrictive elements 14 are formed in such a manner that one end of each of the piezoelectric/electrostrictive elements 14 is located on the stationary portion 11 (or the corresponding holding portion 13), whereas the other end is located on the lateral surface of the corresponding thin-plate portion 12, the thin-plate portions 12 can be driven to a greater extent.

Preferably, the piezoelectric/electrostrictive layers $14b1$ to $14b4$ are formed from a piezoelectric ceramic material. Alternatively, the piezoelectric/electrostrictive layers $14b1$ to $14b4$ may be formed from an electrostrictive ceramic material, a ferroelectric ceramic material, or an antiferroelectric ceramic material. In the case where, in the piezoelectric/electrostrictive device 10, the linearity between the displacement quantity of the holding portions 13 and a drive voltage (or output voltage) is regarded as important, preferably, the piezoelectric/electrostrictive layers $14b1$ to $14b4$ are formed from a material having low strain hysteresis. Therefore, preferably, the piezoelectric/electrostrictive layers $14b1$ to $14b4$ are formed from a material having a coercive electric field of 10 kV/mm or less.

A specific material for the piezoelectric/electrostrictive layers $14b1$ to $14b4$ is a ceramic material containing, singly or in combination, lead zirconate, lead titanate, magnesium lead niobate, nickel lead niobate, zinc lead niobate, manganese lead niobate, antimony lead stannate, manganese lead tungstate, cobalt lead niobate, barium titanate, sodium bismuth titanate, potassium sodium niobate, strontium bismuth tantalate, and the like.

Particularly, a material containing, as a primary component, lead zirconate, lead titanate, or magnesium lead niobate, or a material containing, as a primary component, sodium bismuth titanate is preferred as a material for the piezoelectric/electrostrictive layers $14b1$ to $14b4$, from the viewpoints of high electromechanical coupling coefficient, high piezoelectric constant, low reactivity with the thin-plate (ceramic) portion 12 during sintering of the piezoelectric/electrostrictive layers $14b1$ to $14b4$, and attainment of consistent composition.

Furthermore, there can be employed, as a material for the piezoelectric/electrostrictive layers $14b1$ to $14b4$, a ceramic material containing an oxide of, for example, lanthanum, calcium, strontium, molybdenum, tungsten, barium, niobium, zinc, nickel, manganese, cerium, cadmium, chromium, cobalt, antimony, iron, yttrium, tantalum, lithium, bismuth, or tin. In this case, incorporation of lanthanum or strontium into lead zirconate, lead titanate, or magnesium lead niobate, which is a primary component, may yield in some cases such an advantage that coercive electric field and a piezoelectric characteristic become adjustable.

Notably, addition of a material prone to vitrify, such as silica, to a material for the piezoelectric/electrostrictive layers $14b1$ to $14b4$ is desirably avoided. This is because, silica or a similar material is prone to react with a piezoelectric/electrostrictive material during thermal treatment of the piezoelectric/electrostrictive layers $14b1$ to $14b4$; as a result, the composition of the piezoelectric/electrostrictive material varies with a resultant deterioration in the piezoelectric property.

Meanwhile, preferably, the electrodes $14a1$ to $14a5$ of the piezoelectric/electrostrictive elements 14 are formed from a metal that is solid at room temperature and has excellent electrical conductivity. Examples of the metal include aluminum, titanium, chromium, iron, cobalt, nickel, copper, zinc, niobium, molybdenum, ruthenium, palladium, rhodium, silver, tin, tantalum, tungsten, iridium, platinum, gold, lead, and an alloy of these metals. Furthermore, an electrode material can be a cermet material prepared by dispersing in any of the above metals a material identical to that of the piezoelectric/electrostrictive layers $14b1$ to $14b4$ or that of the thin-plate portions 12.

Selection of an electrode material for use in the piezoelectric/electrostrictive element 14 depends on a method of forming the piezoelectric/electrostrictive layers $14b1$ to $14b4$. For example, in the case where the electrode $14a1$ is formed on the thin-plate portion 12, and then the piezoelectric/electrostrictive layer $14b1$ is formed on the electrode $14a1$ through firing, the electrode $14a1$ must be formed of a high-melting-point metal, such as platinum, palladium, a platinum-palladium alloy, or a silver-palladium alloy, which remains intact even when exposed to a firing temperature of the piezoelectric/electrostrictive layer $14b1$. This also applies to other electrodes (electrodes $14a2$ to $14a4$) whose formation is followed by firing of corresponding piezoelectric/electrostrictive layers.

In contrast, in the case of the outermost electrode $14a5$ to be formed on the piezoelectric/electrostrictive layer $14b4$, the formation of the electrode $14a5$ is not followed by firing of a piezoelectric/electrostrictive layer. Thus, the electrode $14a5$ can be formed from a material containing, as a primary component, a low-melting-point metal, such as aluminum, gold, or silver.

Since the laminar electrodes $14a1$ to $14a5$ possibly cause a reduction in displacement of the piezoelectric/electrostrictive element 14, each of the electrode layers is desirably thin. Particularly, the electrode $14a5$, which is formed after the piezoelectric/electrostrictive layer $14b4$ is fired, is formed preferably from an organic metal paste, which enables the formation of a dense, very thin film after firing. Examples of the paste include a gold resinate paste, a platinum resinate paste, and a silver resinate paste.

Figure 3:
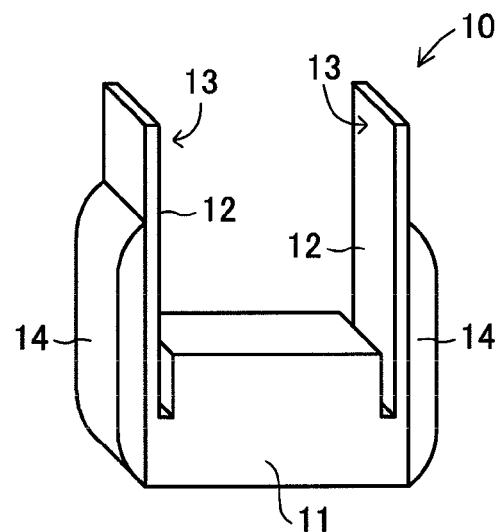
FIG. 3 is a perspective view showing a modification of the piezoelectric/electrostrictive device of FIG. 1.

In the piezoelectric/electrostrictive device 10 of FIG. 1, the protrusions $12a$ for specifying the region where an adhesive is applied are provided. However, the protrusions $12a$ may be omitted as shown in FIG. 3. As a result, when an object is attached to the holding portions 13, an object of a size corresponding to the distance between the holding portions 13 and the thin-plate portions 12 can be held. In this case, regions where an adhesive is applied in order to hold the object substantially serve as the corresponding holding portions 13.

The aforementioned piezoelectric/electrostrictive device 10 can also be employed as an ultrasonic sensor, an acceleration sensor, an angular-velocity sensor, an impact sensor, a mass sensor, or a similar sensor. In application to such a sensor, the piezoelectric/electrostrictive device 10 is advantageous in that sensor sensitivity can be readily adjusted by appropriately regulating the size of an object to be held between the opposed holding portions 13 or between the opposed thin-plate portions 12.

Next will be described a method for manufacturing the aforementioned piezoelectric/electrostrictive device 10. Preferably, a substrate portion (which excludes the piezoelectric/electrostrictive elements 14; i.e., which includes the stationary portion 11, the thin-plate portions 12, and the holding portions 13) of the piezoelectric/electrostrictive device 10 is manufactured by a ceramic green sheet lamination process. Meanwhile, preferably, the piezoelectric/electrostrictive elements 14 are manufactured by a film formation process, which is adapted to form a thin film, a thick film, or a similar film.

A ceramic green sheet lamination process allows integral formation of members of the substrate portion of the piezoelectric/electrostrictive device 10. Thus, employment of a ceramic green sheet lamination process allows a joint portion between members to be almost free from a change in state with passage of time, thereby enhancing the reliability of joint portions and securing rigidity. In the case where the substrate portion is formed by laminating metallic plates, employment of a diffusion joining process allows a joint portion between members to be almost free from a change in state with passage of time, thereby securing the reliability of joint portions, and rigidity.

In the piezoelectric/electrostrictive device 10 of FIG. 1 according to the present embodiment, boundary portions (joint portions) between the thin-plate portions 12 and the stationary portion 11, and boundary portions (joint portions) between the thin-plate portions 12 and the corresponding holding portions 13 serve as fulcrum points for manifestation of displacement. Therefore, the reliability of the joint portions is an important factor that determines the characteristics of the piezoelectric/electrostrictive device 10.

A manufacturing method to be described below features high productivity and excellent formability and thus can yield the piezoelectric/electrostrictive devices 10 having a predetermined shape within a short period of time with good reproducibility.

In the following description, a laminate obtained by laminating a plurality of ceramic green sheets is defined as a ceramic green sheet laminate 22 (see FIG. 5); and a monolithic body obtained by firing the ceramic green sheet laminate 22 is defined as a ceramic laminate 23 (see FIG. 6).

The manufacturing method is embodied desirably as follows: a single sheet equivalent to a plurality of ceramic laminates of FIG. 6 arranged lengthwise and crosswise is prepared; a laminate corresponding to a plurality of laminates 24 (see FIG. 7), which are formed into the piezoelectric/electrostrictive elements 14, is formed continuously on the surfaces of the sheet in predetermined regions; and the sheet is cut, whereby a plurality of piezoelectric/electrostrictive devices 10 are manufactured in the same process. Furthermore, desirably, two or more piezoelectric/electrostrictive devices 10 are yielded in association with a single window (including Wd1 and the like shown in FIG. 4). In order to simplify description, the following description discusses a method for obtaining a single piezoelectric/electrostrictive device 10 from a ceramic laminate by cutting the ceramic laminate.

Firstly, a binder, a solvent, a dispersant, a plasticizer, and the like are mixed with ceramic powder of zirconia or the like, thereby preparing a slurry. The slurry is defoamed. By use of the defoamed slurry, a rectangular ceramic green sheet having a predetermined thickness is formed by a reverse roll coater process, a doctor blade process, or a similar process.

Figure 4:
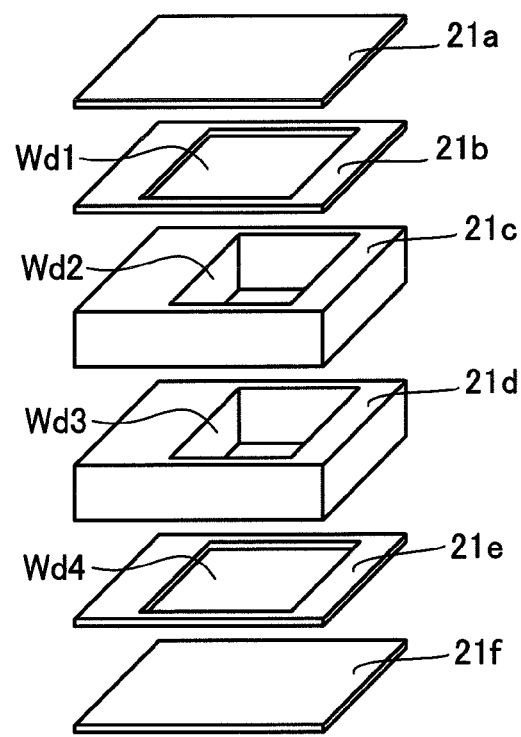
FIG. 4 is a perspective view showing ceramic green sheets to be laminated in a method for manufacturing a piezoelectric/electrostrictive device according to the present invention.

Subsequently, as shown in FIG. 4, if necessary, a plurality of ceramic green sheets 21a to 21f are formed from the above-prepared ceramic green sheet by blanking with a die, laser machining, or similar machining.

In the example of FIG. 4, rectangular windows Wd1 to Wd4 are formed in the ceramic green sheets 21b to 21e, respectively. The windows Wd1 and Wd4 have almost the same shape, and the windows Wd2 and Wd3 have almost the same shape. Each of the ceramic green sheets 21a and 21f includes a portion that is formed into the thin-plate portion 12. Notably, the number of ceramic green sheets is given merely as an example. In the illustrated example, the ceramic green sheets 21c and 21d may be replaced with a single green sheet having a predetermined thickness or with a plurality of ceramic green sheets to be laminated so as to attain the predetermined thickness or with a green sheet laminate having the predetermined thickness.

Figure 5:
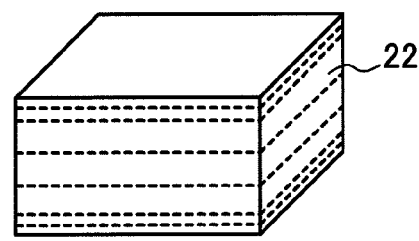
FIG. 5 is a perspective view showing a ceramic green sheet laminate formed by laminating and compression-bonding the ceramic green sheets of FIG. 4.

Thereafter, as shown in FIG. 5, the ceramic green sheets 21a to 21f are laminated and compression-bonded to thereby form the ceramic green sheet laminate 22. Subsequently, the ceramic green sheet laminate is fired to thereby form the ceramic laminate 23 shown in FIG. 6. No particular limitation is imposed on the number and order of compression-bonding operations for forming the ceramic green sheet laminate 22 (for monolithic lamination). In the case where there exists a portion to which pressure is not sufficiently transmitted by uniaxial application of pressure (application of pressure in a single direction), desirably, compression bonding is repeated a plurality of times, or impregnation with a pressure-transmitting substance is employed in compression bonding. Also, for example, the shape of the windows Wd1 to Wd4 and the number and thickness of ceramic green sheets can be appropriately determined in accordance with the structure and function of the piezoelectric/electrostrictive device 10 to be manufactured.

When the above compression bonding for monolithic lamination is performed under application of heat, a more reliable state of lamination is obtained. When a paste, a slurry, or the like that contains a predominant amount of a ceramic powder and a binder and serves as a bonding aid layer is applied to ceramic green sheets by means of coating or printing before the ceramic green sheets are compression-bonded, the state of bonding at the interface between the ceramic green sheets can be enhanced. In this case, preferably, the ceramic powder to be employed as a bonding aid has a composition identical to or similar to a ceramic material employed in the ceramic green sheets 21a to 21f in view of the reliability of bonding. Furthermore, in the case where the ceramic green sheets 21a and 21f are thin, the use of a plastic film (particularly, a polyethylene terephthalate film coated with a silicone-based parting agent) is preferred in handling the ceramic green sheets 21a and 21f. When the windows Wd1 and Wd4 and the like are to be formed in relatively thin sheets, such as the ceramic green sheets 21b and 21e, each of these sheets may be attached to the aforementioned plastic film before a process for forming the windows Wd1 and Wd4 and the like is performed.

Figure 7:
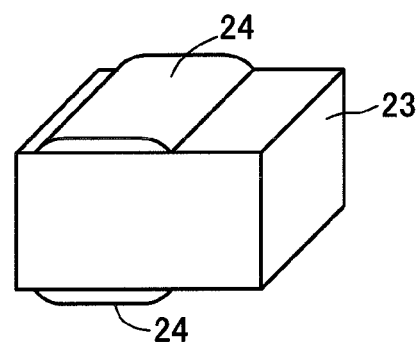
FIG. 7 is a perspective view showing the ceramic laminate of FIG. 6 on which piezoelectric/electrostrictive laminates are formed.

Subsequently, as shown in FIG. 7, the piezoelectric/electrostrictive laminates 24 are formed on the corresponding opposite sides of the ceramic laminate 23; i.e., on the corresponding surfaces of the fired ceramic green sheets 21a and 21f. Examples of methods for forming the piezoelectric/electrostrictive laminates 24 include thick-film formation processes, such as a screen printing process, a dipping process, a coating process, and an electrophoresis process; and thin-film formation processes, such as an ion beam process, a sputtering process, a vacuum deposition process, an ion plating process, a chemical vapor deposition (CVD) process, and a plating process.

Employment of such a film formation process in formation of the piezoelectric/electrostrictive laminates 24 allows the piezoelectric/electrostrictive laminates 24 and the thin-plate portions 12 to be monolithically bonded (disposed) without use of adhesive, thereby securing reliability and reproducibility and facilitating integration.

In this case, more preferably, a thick-film formation process is employed for forming the piezoelectric/electrostrictive laminates 24. A thick-film formation process allows, in film formation, the use of a paste, a slurry, a suspension, an emulsion, a sol, or the like containing, as a primary component, piezoelectric ceramic particles or powder having an average particle size of 0.01 to 5 µm, preferably 0.05 to 3 µm. The piezoelectric/electrostrictive laminates 24 obtained by firing the thus-formed films exhibit a good piezoelectric/electrostrictive characteristic.

An electrophoresis process has such an advantage that a film can be formed with high density and high shape accuracy. A screen printing process can simultaneously perform control of film thickness and pattern formation and thus can simplify a manufacturing process.

An example method for forming the ceramic laminate 23 and the piezoelectric/electrostrictive laminates 24 will be described in detail. Firstly, the ceramic green sheet laminate 22 is monolithically fired at a temperature of 1,200 to 1,600°

Figure 6:
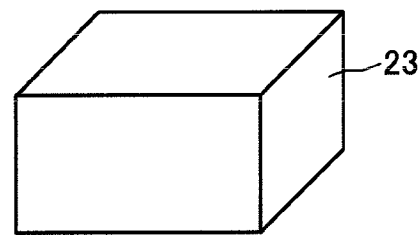
FIG. 6 is a perspective view showing a ceramic laminate formed by monolithically firing the ceramic green sheet laminate of FIG. 5.

C., thereby yielding the ceramic laminate 23 shown in FIG. 6. Thereafter, as shown in FIG. 2, the electrodes 14a1 are printed on the corresponding opposite sides of the ceramic laminate 23 at a predetermined position, followed by firing. Subsequently, the piezoelectric/electrostrictive layers 14b1 are printed and fired. The electrodes 14a2 are printed on the corresponding piezoelectric/electrostrictive layers 14b1, followed by firing. Such an operation is repeated a predetermined number of times to thereby form the piezoelectric/electrostrictive laminates 24. Thereafter, a terminal (not illustrated) for electrically connecting the electrodes 14a1, 14a3, and 14a5 to a drive circuit, and a terminal (not illustrated) for electrically connecting the electrodes 14a2 and 14a4 to the drive circuit are printed and fired.

Alternatively, the piezoelectric/electrostrictive laminates 24 may be formed as follows. The bottom electrode 14a1 is printed and fired. Subsequently, the piezoelectric/electrostrictive layer 14b1 and the electrode 14a2 are printed and are then simultaneously fired. Thereafter, in a manner similar to that described above, a process in which a single piezoelectric/electrostrictive layer and a single electrode are printed and then simultaneously fired is repeated a predetermined number of times.

In this case, for example, the electrodes 14a1, 14a2, 14a3, and 14a4 are formed from a material containing, as a primary component, platinum (Pt); the piezoelectric/electrostrictive layers 14b1 to 14b4 are formed from a material containing, as a primary component, lead zirconate titanate (PZT); the electrode 14a5 is formed from gold (Au); and the terminals are formed from silver (Ag). In this manner, materials are selected in such a manner that their firing temperature lowers in the ascending order of lamination. As a result, at a certain firing stage, a material(s) that has been fired is free from re-sintering, thereby avoiding occurrence of a problem, such as the exfoliation or cohesion of an electrode material.

The selection of appropriate materials allows the members of the piezoelectric/electrostrictive laminates 24 and the terminals to be sequentially printed and then monolithically fired in a single firing operation. Also, the piezoelectric/electrostrictive laminate 24 may be formed as follows: the firing temperature for the outermost piezoelectric/electrostrictive layer 14b4 is regulated to be higher than that for the piezoelectric/electrostrictive layers 14b1 to 14b3, so as to finally bring the piezoelectric/electrostrictive layers 14b1 to 14b4 into the same sintered state.

The members of the piezoelectric/electrostrictive laminates 24 and the terminals may be formed by a thin-film formation process, such as a sputtering process or a vapor deposition process. In this case, thermal treatment is not necessarily required.

The following simultaneous firing process may be employed. The piezoelectric/electrostrictive laminates 24 are formed on the corresponding opposite sides of the ceramic green sheet laminate 22; i.e., on the corresponding surfaces of the ceramic green sheets 21a and 21f. Subsequently, the ceramic green sheet laminate 22 and the piezoelectric/electrostrictive laminates 24 are simultaneously fired.

In an example method for simultaneously firing the piezoelectric/electrostrictive laminates 24 and the ceramic green sheet laminate 22, precursors of the piezoelectric/electrostrictive laminates 24 are formed by a tape formation process employing a slurry raw material, or a similar process; the precursors of the piezoelectric/electrostrictive laminates 24 are laminated on the corresponding opposite sides of the ceramic green sheet laminate 22 by thermo-compression bonding or a similar technique; and subsequently the precursors and the ceramic green sheet laminate 22 are simultaneously fired. However, in this method, the electrodes 14a1 must be formed in advance on the corresponding opposite sides of the ceramic green sheet laminate 22 and/or on the corresponding piezoelectric/electrostrictive laminates 24 by means of any film formation process described above.

In another method, the electrodes 14a1 to 14a5 and the piezoelectric/electrostrictive layers 14b1 to 14b4, which are component layers of the piezoelectric/electrostrictive laminates 24, are screen-printed at least on those portions of the ceramic green sheet laminate 22 which are finally formed into the corresponding thin-plate portions 12; and the component layers and the ceramic green sheet laminate 22 are simultaneously fired.

The firing temperature for a component layer of the piezoelectric/electrostrictive laminates 24 is appropriately determined on the basis of the material of the component layer, but is generally 500 to 1,500° C. The preferred firing temperature for the piezoelectric/electrostrictive layers 14b1 to 14b4 is 1,000 to 1,400° C. In this case, preferably, in order to control the composition of the piezoelectric/electrostrictive layers 14b1 to 14b4, sintering is performed in such a state that evaporation of the material of the piezoelectric/electrostrictive layers 14b1 to 14b4 is controlled (for example, in the presence of an evaporation source). In the case where the piezoelectric/electrostrictive layers 14b1 to 14b4 and the ceramic green sheet laminate 22 are simultaneously fired, their firing conditions must be compatible with each other. The piezoelectric/electrostrictive laminates 24 are not necessarily formed on the corresponding opposite sides of the ceramic laminate 23 or the ceramic green sheet laminate 22, but may be formed only on a single side of the ceramic laminate 23 or the ceramic green sheet laminate 22.

Subsequently, as stated above, unnecessary parts are cut off from the ceramic laminate 23 on which piezoelectric/electrostrictive laminates 24 are formed ("a piece comprising a ceramic laminate 23 and piezoelectric/electrostrictive laminates 24" composing a piezoelectric/electrostrictive device 10 afterward is hereunder referred to as "a work piece" occasionally). That is, the work piece is cut along the cutting lines (broken lines) C1 to C4 shown in FIG. 8. As the cutting means, machining or the like such as wire sawing, dicing, or the like, can be adopted.

Figure 8:
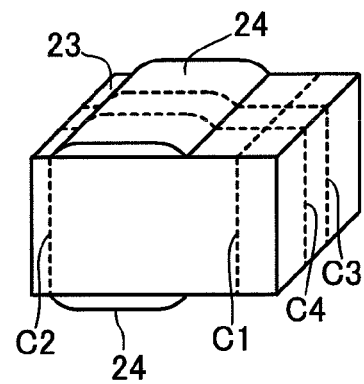
FIG. 8 illustrates a step of cutting the ceramic laminate and the piezoelectric/electrostrictive laminates shown in FIG. 7.

In the cutting, the cutting of the work piece along the cutting lines C3 and C4 shown in FIG. 8 includes the cutting of the piezoelectric/electrostrictive laminates 24 comprising brittle piezoelectric/electrostrictive layers having a relatively low strength and a metal having glutinous ductility and hence it is desirable not to adopt dicing which imposes heavy processing load on the work piece at the cutting but to adopt other processing which imposes light processing load on the work piece. In particular, the wire sawing which is suitable for simultaneous cutting and forming of a plurality of piezoelectric/electrostrictive devices 10 and imposes low processing load is appropriate for such cutting.

Further, not in the case of cutting a composite comprising pluralities of ceramics, electrodes, and piezoelectric/electrostrictive layers having mechanical properties (physical properties related to cutting) different from each other like cutting along the cutting lines C3 and C4 but in the case of cutting the portions comprising ceramics having mechanical properties identical or similar to each other like cutting along the cutting lines C1 and C2, another processing method may be used besides wire sawing. For example, it is preferable to adopt dicing in the case of cutting along the cutting lines C1 and C2.

By cutting a work piece along the cutting lines C1 to C4 shown in FIG. 8 as stated above, a work piece which does not yet have protrusions 12a to be formed thereon and is not yet subjected to the specific processing that will be described later but corresponds to a piezoelectric/electrostrictive device 10 shown in FIG. 1 is obtained.

Subsequently, protrusions that compose protrusions 12a afterward (namely, protrusions 12a before sintered) are formed onto such a work piece at prescribed positions of the work piece respectively with the slurry identical to the slurry used in the forming of the aforementioned ceramic green sheets 21a to 21f. As a method for forming such protrusions too, in the same way as the aforementioned method for forming piezoelectric/electrostrictive laminates 24, thick-film forming processes such as a screen printing process, a dipping process, a coating process, and an electrophoresis process, and thin-film forming processes such as an ion beam process, a sputtering process, a vacuum deposition process, an ion plating process, a chemical vapor deposition (CVD) process, and a plating process can be used.

Subsequently, the work piece on which the protrusions are formed is sintered. Thereby the protrusions 12a sintered integrally with the material identical to the material of the thin-plate portions 12 are formed. As a result, a work piece which is not yet subjected to the specific processing and corresponds to the piezoelectric/electrostrictive device 10 shown in FIG. 1 (hereunder referred to as "pre-specific processing piezoelectric/electrostrictive device") is obtained.

Then finally, the specific processing is applied to two lateral end surfaces of the pre-specific processing piezoelectric/electrostrictive device (namely, cut planes along the aforementioned cutting lines C3 and C4) corresponding to two lateral end surfaces of the piezoelectric/electrostrictive device 10. Thereby the piezoelectric/electrostrictive device 10 shown in FIG. 1 is produced.

Such specific processing is hereunder explained in detail. The purpose of the specific processing is, when the piezoelectric/electrostrictive device 10 is actually used, to effectively suppress the generation of the aforementioned electric leakage and ion migration by effectively suppressing the deposition of moisture on the lateral end surfaces of piezoelectric/electrostrictive elements 14 (in particular, the lateral end surfaces of the piezoelectric/electrostrictive layers 14b1 to 14b4, refer to FIG. 2).

More specifically, the purpose of the specific processing is to: reduce the actual surface area (hereunder referred to as "actual surface area Sact") of the lateral end surfaces of piezoelectric/electrostrictive elements 14 (namely, the whole lateral end surface comprising the lateral end surfaces of the piezoelectric/electrostrictive layers 14b1 to 14b4 and the lateral end surfaces of the electrodes 14a1 to 14a5); and resultantly reduce the ratio "Sact/Spro" (namely, the surface area increase rate Smag) of the actual surface area Sact of the lateral end surfaces of the piezoelectric/electrostrictive elements 14 to the area Spro of the lateral end surfaces of the piezoelectric/electrostrictive elements 14 in the orthographic projection. This is based on the fact that moisture tends to hardly deposit on the lateral end surfaces of the piezoelectric/electrostrictive elements 14 (namely, the lateral end surfaces of the piezoelectric/electrostrictive layers 14b1 to 14b4) as the actual surface area Sact of the lateral end surfaces of the piezoelectric/electrostrictive elements 14 reduces (namely as the surface area increase rate Smag lowers).

The specific processing may be processed by, for example, YAG laser processing, excimer laser processing, dry ice blasting, ultrasonic cleaning, heat treatment, polishing, or the combination of polishing and heat treatment. The outlines of concrete examples of the processing are hereunder explained one by one.

(No. 1: YAG Laser Processing)

YAG laser processing is applied, for example, to two lateral end surfaces of a pre-specific processing piezoelectric/electrostrictive device with a YAG tertiary laser machine "Micro Machining System Model 4420" made by Nihon ESI K.K. under the following conditions. By so doing, the lateral end surfaces of piezoelectric/electrostrictive elements 14 remelt, thereby the bumps and dips on the lateral end surfaces reduce (or parts of the bumps and dips disappear), and resultantly the actual surface area Sact of the lateral end surfaces (namely, the surface area increase rate Smag) reduces.

<YAG Laser Processing Conditions>

The pulse frequency is set at 4 kHz.
The machining speed is set at 1 mm/sec.
The YAG tertiary laser wavelength is set at 355 nm.

(No. 2: Excimer Laser Processing)

Excimer laser processing is applied, for example, to two lateral end surfaces of a pre-specific processing piezoelectric/electrostrictive device with an excimer laser machine "Excimer Work System MEX-24-M" made by Mitsubishi Electric Corporation under the following conditions. By so doing, the lateral end surfaces of piezoelectric/electrostrictive elements 14 remelt, thereby the bumps and dips on the lateral end surfaces reduce (or parts of the bumps and dips disappear), and resultantly the actual surface area Sact of the lateral end surfaces (namely, the surface area increase rate Smag) reduces.

<Excimer Laser Processing Conditions>

The KrF laser wavelength is set at 248 nm.

(No. 3: Dry Ice Blasting)

Dry ice blasting is applied, for example, to two lateral end surfaces of a pre-specific processing piezoelectric/electrostrictive device with a dry ice blasting machine "CO2 Cleanblast Precision Series Model T-2" made by Alpheus Cleaning Technologies Corporation under prescribed conditions. By so doing, the minute bumps on the lateral end surfaces of piezoelectric/electrostrictive elements 14 are shaved off, thereby the bumps and dips on the lateral end surfaces reduce, and resultantly the actual surface area Sact of the lateral end surfaces (namely, the surface area increase rate Smag) reduces.

(No. 4: Ultrasonic Cleaning)

Ultrasonic cleaning is carried out, for example, by putting a pre-specific processing piezoelectric/electrostrictive device into a prescribed solution with which abrasive grains of the following conditions are mixed and applying ultrasonic cleaning to the whole surface of the pre-specific processing piezoelectric/electrostrictive device with a prescribed ultrasonic cleaning machine under prescribed conditions. By so doing, the minute bumps on the lateral end surfaces of piezoelectric/electrostrictive elements 14 are shaved off, thereby the bumps and dips on the lateral end surfaces reduce, and resultantly the actual surface area Sact of the lateral end surfaces (namely, the surface area increase rate Smag) reduces.

<Ultrasonic Cleaning Conditions>

Ultrasonic cleaning A: #800 Al2O3 is used as the abrasive grains.

Ultrasonic cleaning B: #1000 SiC is used as the abrasive grains.

(No. 5: Heat Treatment)

Heat treatment is carried out, for example, by heating the whole of a pre-specific processing piezoelectric/electrostrictive device in an atmosphere furnace "Electric Furnace TMF-3200-R" made by TOKYO RIKAKIKAI CO. LTD. under the following conditions. By so doing, the lateral end surfaces of piezoelectric/electrostrictive elements 14 are sintered again (or remelt to some extent), thereby the bumps and dips on the lateral end surfaces reduce (or parts of the bumps and dips disappear), and resultantly the actual surface area Sact of the lateral end surfaces (namely, the surface area increase rate Smag) reduces.

<Heat Treatment Conditions>
Heat treatment A: 800° C. is maintained for one hour.
Heat treatment B: 900° C. is maintained for one hour.
Heat treatment C: 1,000° C. is maintained for one hour.

(No. 6: CMP)

CMP (chemical mechanical polishing, mechanochemical polishing) is one of the polishing methods for reducing surface roughness by lapping or polishing a surface and is a polishing method that uses an alkaline polishing solution and abrasive grains such as colloidal silica 100 nm or less in average grain diameter as the abrasives.

In the polishing method, a polishing object is chemically dissolved by accelerating at the site the chemical reaction between the polishing object and a polishing fluid by energy such as heat generated when minute abrasives collide with the polishing object. In the method, since the processing is carried out not by mechanical destruction with abrasive grains but by chemical dissolution reaction, there is the advantage that the state where no scratches are caused and thus the strain remaining on the polished plane (processing strain, internal stress) is low or scarcely exists can be obtained. By applying the method to the surface treatment in the processing of a piezoelectric/electrostrictive device, it is possible to suppress the generation of particles from the processing plane, namely particle separation from the processing plane. By so doing, minute bumps on the lateral end surfaces of piezoelectric/electrostrictive elements 14 are dissolved and thereby reduce, and resultantly the actual surface area Sact of the lateral end surfaces (namely, the surface area increase rate Smag) reduces.

<CMP Conditions>
The abrasive: Clearlite S made by Fujimi
Polishing cloth: Surfin 018-3 (suede) made by Fujimi, 12 inches, 100 rpm/min, load 0.4 kg The surface roughness of the lateral end surfaces of the piezoelectric/electrostrictive layers after subjected to CMP under the conditions was 0.03 μm or less in Ry. Here, very fine abrasive grains (100 nm or less in grain diameter) are used in CMP. After the CMP therefore, it is necessary to sufficiently apply blush cleaning or ultrasonic cleaning in order to remove such very fine abrasive grains (minute particles). When ultrasonic cleaning is applied in particular, it is preferable to use ultrasonic waves having the frequencies of 50 kHz or more, preferably 100 kHz or more in order to reduce damages to piezoelectric/electrostrictive elements and secure high detergency to minute particles.

(No. 7: Double Heat Treatment)

Double heat treatment is carried out in sequence, in the same way as No. 5 heat treatment mentioned earlier for example, by heating the whole of a pre-specific processing piezoelectric/electrostrictive device in an atmosphere furnace "Electric Furnace TMF-3200-R" made by TOKYO RIKAKIKAI CO. LTD. In this case, the temperature in the first heat treatment is set at a temperature higher than the temperature in the second heat treatment. By so doing, the lateral end surfaces of piezoelectric/electrostrictive elements 14 are repeatedly sintered again (or remelt to some extent), thereby the bumps and dips on the lateral end surfaces reduce (or parts of the bumps and dips disappear), and resultantly the actual surface area Sact of the lateral end surfaces (namely, the surface area increase rate Smag) reduces. Here, ultrasonic cleaning is applied between the first heat treatment and the second heat treatment.

<Double Heat Treatment Conditions>
First heat treatment: 800° C. to 1,000° C. is maintained for an hour.
Second heat treatment: 600° C. is maintained for an hour.

(No. 8: Double Polishing)

Such a piezoelectric/electrostrictive device comprises a substrate portion and piezoelectric/electrostrictive elements 14 integrally formed on the substrate portion as stated above. That is, a piezoelectric/electrostrictive device comprises materials having different workability (processing characteristics); such as zirconia as a hard material composing the substrate portion, a piezoelectric/electrostrictive material as a relatively soft material composing piezoelectric/electrostrictive layers, and a metallic material composing electrodes.

A resultant problem here is that, if working conditions are adjusted to zirconia as the hard material for example, the piezoelectric/electrostrictive material tends to be shaved excessively. On the other hand, if working conditions are adjusted to the piezoelectric/electrostrictive material as a relatively soft material, the problem is that a long working time is required since zirconia is hardly processed. Another problem is that the lateral end surfaces of a piezoelectric/electrostrictive material (piezoelectric/electrostrictive elements) as a relatively soft material tend to crack.

To solve the problems, a first polishing process of applying curved surface forming (R forming) or chamfering to corners of the lateral end surfaces of the piezoelectric/electrostrictive elements 14 by polishing and a second polishing process of thereafter forming the piezoelectric/electrostrictive elements 14 by polishing and thus finishing the planar portions (surfaces) of the lateral end surfaces of the piezoelectric/electrostrictive elements 14 by polishing are applied here. By so doing, minute dips on the lateral end surfaces of the piezoelectric/electrostrictive elements 14 are shaved off, thereby the bumps and dips on the lateral end surfaces reduce, and resultantly the actual surface area Sact of the lateral end surfaces (namely, the surface area increase rate Smag) reduces.

The production method focuses attention on the fact that the concentration of impact on the corners can be avoided by applying R forming or chamfering (hereunder referred to simply as "R forming") to the corners of the lateral end surfaces of piezoelectric/electrostrictive elements 14 (the lateral end surfaces of a piezoelectric/electrostrictive device). That is, when the lateral end surfaces of the piezoelectric/electrostrictive elements 14 (the lateral end surfaces of the piezoelectric/electrostrictive device) are polished, R forming is applied to the corners beforehand. It has been found that, by so doing, cracking can be avoided even when a relatively heavy load is imposed thereafter by polishing on the planar portions (surfaces) of the lateral end surfaces. It has also been found that the working time is shortened.

<Double Polishing Conditions>
As the first polishing (polishing of the corners of lateral end surfaces)

Abrasive: diamond slurry 1 μm in average grain diameter
Polishing cloth: Surfin 191 made by Fujimi
12 inches, 100 rpm/min, load 0.4 kg As the second polishing (polishing of the planar portions of lateral end surfaces)

Abrasive: diamond slurry 0.5 μm in average grain diameter
Polishing cloth: K-0013 made by Fujimi
12 inches, 100 rpm/min, load 0.4 kg Here, the surface roughness of the planar portions of the lateral end surfaces of the piezoelectric/electrostrictive layers after subjected to the second polishing under the conditions was 0.03 μm or less in terms of Ry. Further, CMP may be applied as the first polishing. By so doing, CMP of low processing strain is applied to the corers of the lateral end surfaces which are likely to crack and hence it is possible to reduce the chips and cracks at the lateral end surfaces. Moreover, the processing speed of polishing can be increased in comparison with the case of using diamond slurry as the abrasive and thus working efficiency can be improved.

(No. 9: Double Polishing+Double Heat Treatment)

The double polishing here is also carried out under the same conditions as the double polishing in No. 8. R forming is applied to the corners of the lateral end surfaces of piezoelectric/electrostrictive elements 14, also the planar portions of the lateral end surfaces of the piezoelectric/electrostrictive elements 14 are finished by polishing, thereafter cleaning is applied, subsequently heat treatment (the first heat treatment) is applied, and thereby the organic components in the deposits which have not been removed by the above cleaning can be removed. Further, the solid phase reaction of the particles on the surfaces of the lateral end surfaces (hereunder referred to also as "processing planes") of the piezoelectric/electrostrictive elements is accelerated and thereby the processing strain on the processing planes is restored and the particle separation from the processing planes of the piezoelectric/electrostrictive elements can be reduced.

Meanwhile, inorganic components in the deposits remain as ash after the first heat treatment and hence must be removed by applying cleaning again after the first heat treatment. In this case, by further applying heat treatment again (the second heat treatment) after the first heat treatment, the effect of reducing particle separation from the pores in the piezoelectric/electrostrictive elements is added.

<Conditions of Double Hat Treatment after Double Polishing>

First heat treatment: 600° C. is maintained for an hour.
Second heat treatment: 600° C. is maintained for an hour.

Here, the surface roughness of the planar portions of the lateral end surfaces of the piezoelectric/electrostrictive layers obtained after polishing was 1 μm or less in terms of Ra.

Additional explanations are hereunder made with regard to the case where such heat treatment is applied as specific processing. When such heat treatment is applied at a relatively high heat treatment temperature, as a material of terminal electrodes (not shown in figures) or the outermost electrode 14a5, for example, a substance formed by adding zirconia Zr, rhodium Rd, or the like by 500 ppm or more to gold resinated paste or Pt resinated paste is preferably used. By so doing, the thermal resistance of the membranes composing the terminal electrodes and the outermost electrode 14a5 improves.

In this case, the thicknesses of the membranes are thicker than the case of not applying heat treatment by preferably 0.1 μm or more, yet preferably 0.5 μm or more, and still preferably 1 μm or more. However, as the membrane thicknesses increase, the displacement of the piezoelectric/electrostrictive elements 14 lowers. Therefore, it is preferable to set a heat treatment temperature, a membrane thickness, and others at respective optimum values in accordance with items required by a piezoelectric/electrostrictive device 10.

Further, when the displacement required by piezoelectric/electrostrictive elements 14 is large, it is preferable to use gold paste for a high temperature having high thermal resistance or Pt or Pt/PZT cermet as a material for the terminal electrodes or the outermost electrode 14a5.

Here, when Pt/PZT cermet is used, the blend ratio of Pt to PZT is required to be set at a value which can sufficiently assure the conductivity of electrodes. Specifically, the blend ratio of Pt to PZT (in volume ratio) is preferably one or more, and yet preferably four or more.

Further, when Pt or PTZ cermet is used as a material for the terminal electrodes or the outermost electrode 14a5, ether printing and sintering may individually be applied to each layer or the outermost electrode 14a5 and the terminal electrodes may be printed after the printing of the piezoelectric/electrostrictive layer 14b4 and then the piezoelectric/electrostrictive layers 14b1 to 14b4, the electrodes 14a1 to 14a5, and the terminal electrodes may be sintered simultaneously.

Furthermore, it is preferable that the heat treatment temperature is set in the range of 800° C. to 1,400° C. The reason is that, if the heat treatment temperature is lower than 800° C., the effect of heat treatment such as the re-sintering of the lateral end surfaces of piezoelectric/electrostrictive elements 14 is not recognized, and, in contrast, if the heat treatment temperature exceeds 1,400° C., the decomposition of PZT occurs. However, when the heat treatment temperature is set at 1,000° C. or higher, it is preferable to apply heat treatment in the state where a substance (PZT evaporation source) comprising a material identical to the material of the piezoelectric/electrostrictive layers 14b1 to 14b4 is put into the furnace in order to control the vapor pressure of the material (PZT) of the piezoelectric/electrostrictive layers 14b1 to 14b4 (namely, in order to control the composition of the material of the piezoelectric/electrostrictive layers 14b1 to 14b4).

Furthermore, when an atmosphere furnace is used, it is preferable that the heat treatment temperature is set in the range of 800° C. to 1,000° C. The reason is that, when an atmosphere furnace is used, if the heat treatment temperature is lower than 800° C., the effect of heat treatment such as the re-sintering of the lateral end surfaces of piezoelectric/electrostrictive elements 14 is not recognized, and, in contrast, if the heat treatment temperature exceeds 1,000° C., the decomposition of PZT occurs. Here, when an atmosphere furnace is used, it is yet preferable to set the heat treatment temperature in the range of 850° C. to 950° C.

In addition, as the specific processing, it is preferable to adopt heat treatment rather than the aforementioned laser processing, blasting, and ultrasonic cleaning. The reason is that the heat treatment can be applied with relatively inexpensive equipment, can process a large amount at a time, and thus is excellent in mass production.

Next, tests for confirming the effect of the specific processing shown in Nos. 1 to 9 were carried out and the contents and the results of the tests are explained hereunder. The tests for confirming the effect were carried out under the following procedures.

Firstly, as the test samples according to the present invention, test samples made by YAG laser processing under the aforementioned conditions (two YAG laser processed samples), test samples made by excimer laser processing under the aforementioned conditions (two excimer laser processed samples), test samples made by dry ice blasting processing under the aforementioned conditions (two dry ice blasting processed samples), a test sample made by applying ultrasonic cleaning A under the aforementioned conditions (one sample subjected to ultrasonic cleaning A), a test sample made by applying ultrasonic cleaning B under the aforementioned conditions (one sample subjected to ultrasonic cleaning B), a test sample made by applying heat treatment A under the aforementioned conditions (one sample subjected to heat treatment A), a test sample made by applying heat treatment B under the aforementioned conditions (one sample subjected to heat treatment B), a test sample made by applying heat treatment C under the aforementioned conditions (one sample subjected to heat treatment C), a test sample made by applying CMP under the aforementioned conditions (one sample subjected to CMP), a test sample made by applying double heat treatment under the aforementioned conditions (one sample subjected to double heat treatment), a test sample made by applying double polishing under the aforementioned conditions (one sample subjected to double polishing), and a test sample made by applying double polishing and double heat treatment under the aforementioned conditions (one sample subjected to double polishing and double heat treatment) were prepared. And as the test samples for comparison, pre-specific processing piezoelectric/electrostrictive devices (two samples not subjected to specific processing) were prepared.

Subsequently, for each test sample, the surface area increase rate Smag (=Sact/Spro) of the lateral end surfaces of the piezoelectric/electrostrictive elements 14 was measured. The measurement was carried out by using a confocal scanning laser microscope "OLS 1100" made by OLYMPUS CORPORATION and evaluating the shapes of the minute bumps and dips (three-dimensional shapes) of the lateral end surfaces of the piezoelectric/electrostrictive elements 14 of each test sample through image analysis. Here, the surface area increase rate Smag can also be measured similarly with, in place of a confocal scanning laser microscope, another device that allows recognizing a three-dimensional shape on the surface including the shapes of minute bumps and dips as three-dimensional position data by analyzing an image of the surface. As such a device for example, there is an atomic force microscope (for example, Nano Scope 4 made by Digital Instruments, Inc., or the like).

The results of the effect confirmation tests are shown in Table 1. In order to make it easier to understand the effect of the specific processing on the reduction of the surface area increase rate Smag, in Table 1, not only the measurement results of the surface area increase rate Smag of each test sample but also the measurement results of the ratio "Smag/Smagref" (hereunder referred to as "surface area increase rate ratio ratioSmag) of the surface area increase rate Smag of each test sample to the reference surface area increase rate Smagref (=5), which is the surface area increase rate of the reference sample that is a test sample not subjected to specific processing and has the surface area increase rate of five, are also shown. Further, the computation results of the surface area increase rate ratio ratioSmag are graphically shown in FIG. 9.

TABLE 1

| No. | Test sample | Remarks | Smag | ratioSmag |
|---|---|---|---|---|
| 0 | No specific-processing sample | Standard sample | 5 | 1 |
|  |  |  | 4.7 | 0.94 |
| 1 | YAG laser processed sample |  | 2.75 | 0.55 |
|  |  |  | 2.63 | 0.526 |
| 2 | Excimer laser processed sample |  | 3.28 | 0.656 |
|  |  |  | 2.75 | 0.55 |
| 3 | Dry ice blasted sample |  | 3.7 | 0.74 |
|  |  |  | 3.6 | 0.72 |

TABLE 1-continued

| No. | Test sample |  | Remarks | Smag | ratioSmag |
|---|---|---|---|---|---|
| 4 | Ultrasonic-cleaned sample | A | #800 | 3.5 | 0.7 |
|  |  | B | #1000 | 3.4 | 0.68 |
| 5 | Heat-treated sample | A | 800° C. | 3.01 | 0.602 |
|  |  | B | 900° C. | 1.69 | 0.338 |
|  |  | C | 1,000° C. | 1.72 | 0.334 |
| 6 | Chemical-mechanical polished sample |  |  | 1.20 | 0.24 |
| 7 | Double heat-treated sample |  |  | 3.91 | 0.78 |
| 8 | Double polished sample |  |  | 1.49 | 0.30 |
| 9 | Double polished + double heat-treated sample |  |  | 1.34 | 0.27 |

As it is understood from Table 1, the surface area increase rate Smag of the lateral end surfaces of piezoelectric/electrostrictive elements 14 is always larger than "four" in the cases of the test samples not subjected to the specific processing (two samples) but, in contrast, always "four" or less in the cases of the piezoelectric/electrostrictive devices 10 (15 samples) according to the present invention that are subjected to the specific processing.

In other words, whereas the surface area increase rate Smag of the lateral end surfaces of the piezoelectric/electrostrictive elements 14 that are formed by cutting through wire sawing is always larger than "four," the surface area increase rate Smag decreases to "four" or less (or "4.5" or less, or "3.7" or less) when any one of Nos. 1 to 9 specific processing is applied.

Further, as it is understood from Table 1, when YAG laser processing, heat treatment, or polishing is applied as the specific processing, the surface area increase rate Smag is about "three" or less and a large effect on the reduction of the surface area increase rate Smag can be obtained. In particular, when CMP, double polishing, or double polishing and double heat treatment is applied, the surface area increase rate Smag is about "1.5" or less and a considerably large effect on the reduction of the surface area increase rate Smag can be obtained.

In this way, the effect of the specific processing on the reduction of the surface area increase rate Smag of the lateral end surfaces of piezoelectric/electrostrictive elements 14 (namely, the effect on the reduction of the actual surface area Sact) has been confirmed. Here, in this case (the case of the reference surface area increase rate Smagref=5), "surface area increase rate Smag=4" corresponds to "surface area increase rate ratio ratioSmag=0.8" (refer to FIG. 9). Here, such a surface area is measured in the state of excluding the portions corresponding to obviously unusual surface shapes such as defects, voids, and the like on the surface.

Further, the present inventors have confirmed separately through prescribed durability tests, acceleration tests, and others that, when such a piezoelectric/electrostrictive device 10 is actually used under usual service conditions, the deposition of moisture on the lateral end surfaces thereof is sufficiently suppressed and resultantly electric leakage and ion migration do not substantially occur as long as the surface area increase rate Smag of the lateral end surfaces of the piezoelectric/electrostrictive elements 14 is "4.5" or less, or preferably "4" or less.

For example, the present inventors carried out durability tests of applying interelectrode voltage of 20±20 V having the sine wave of 6 kHz for 1,000 hours in the circumference of 85° C. in temperature and 85% in humidity with a clean thermo-hygrostat "PCR-3KP" made by Tabai Espec Corporation. The degree of occurrence of the electric leakage and ion migration as stated above was confirmed by measuring the dielectric resistance R between the electrodes of the piezoelectric/electrostrictive elements 14.

Figure 9:
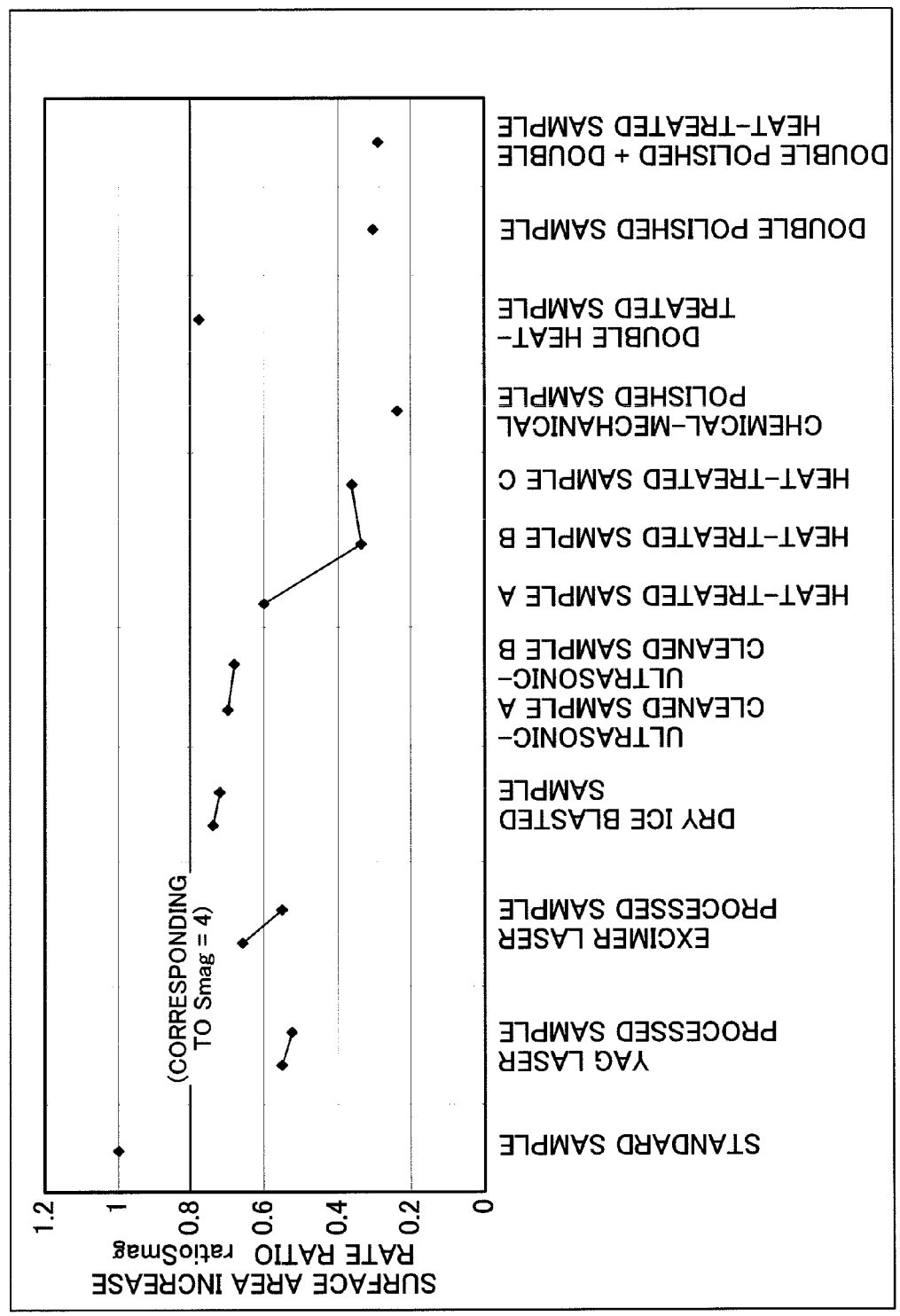
FIG. 9 is a graph showing the data on the ratios of the surface area increase rates of the lateral end surfaces of respective piezoelectric/electrostrictive elements with regard to respective test samples subjected to respective specific processing according to the present invention and a test sample before subjected to the specific processing.
Figure 10:
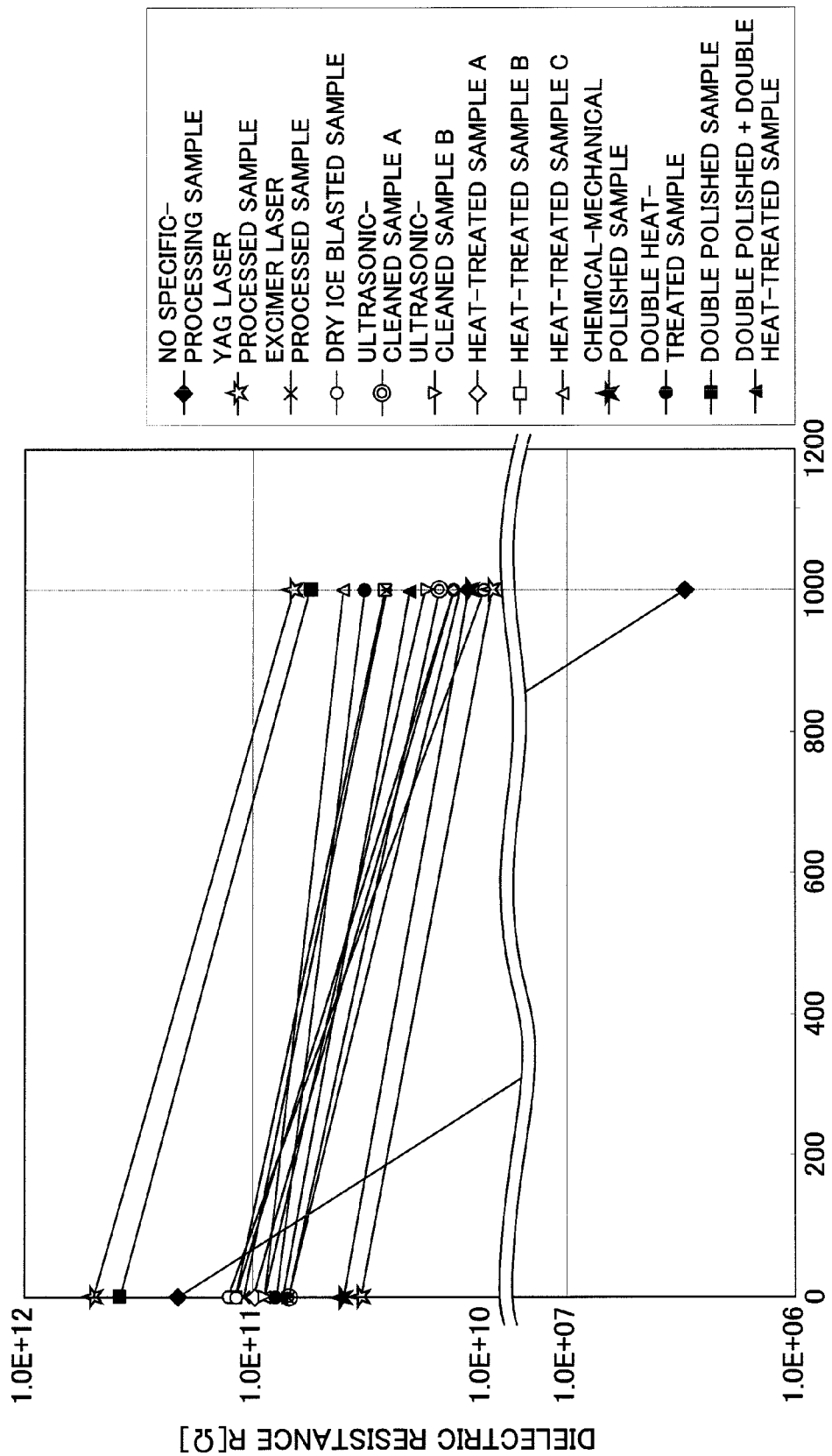
FIG. 10 is a graph showing the data on dielectric resistance between the electrodes of respective piezoelectric/electrostrictive elements with regard to respective test samples subjected to respective specific processing according to the present invention and a test sample before subjected to the specific processing.

Table 2 and FIG. 10 show the results of measuring the dielectric resistance R between the electrodes of the piezoelectric/electrostrictive elements 14 respectively with regard to the same test samples as used when the data shown in Table 1 (in FIG. 9 accordingly) are measured.

TABLE 2

| No. | Test sample | | Remarks | R(0 h) | R(1000 h) |
|---|---|---|---|---|---|
| 0 | No specific-processing sample | | Standard sample | 2.2E+11 | 3.0E+06 |
| 1 | YAG laser processed sample | | | 5.0E+11 | 6.7E+10 |
|   |   |   |   | 3.4E+10 | 9.2E+09 |
| 2 | Excimer laser processed sample | | | 7.0E+10 | 1.3E+10 |
|   |   |   |   | 1.1E+11 | 2.6E+10 |
| 3 | Dry ice blasted sample | | | 1.2E+11 | 1.4E+10 |
|   |   |   |   | 1.3E+11 | 9.9E+09 |
| 4 | Ultrasonic-cleaned sample | A | #800 | 7.0E+10 | 1.6E+10 |
|   |   | B | #1000 | 9.0E+10 | 1.8E+10 |
| 5 | Heat-treated sample | A | 800° C. | 1.0E+11 | 1.3E+10 |
|   |   | B | 900° C. | 1.2E+11 | 2.7E+10 |
|   |   | C | 1,000° C. | 9.0E+10 | 4.1E+10 |
| 6 | Chemical-mechanical polished sample | | | 4.2E+10 | 1.5E+10 |
| 7 | Double heat-treated sample | | | 8.5E+10 | 3.0E+10 |
| 8 | Double polished sample | | | 3.2E+11 | 5.1E+10 |
| 9 | Double polished + double heat-treated sample | | | 8.0E+10 | 2.0E+10 |

As it is understood from Table 2 and FIG. 10, the dielectric resistance R between the electrodes of the piezoelectric/electrostrictive elements 14 largely lowers in the case of the test sample not subjected to the specific processing (one test sample) but scarcely lowers in the cases of the piezoelectric/electrostrictive devices 10 (15 test samples) subjected to the specific processing according to the present invention. That is, it has been confirmed that, when such a piezoelectric/electrostrictive device 10 is actually used under usual service conditions, the deposition of moisture on the lateral end surfaces of the piezoelectric/electrostrictive elements 14 can sufficiently be suppressed (namely, high withstand voltage) by applying the specific processing to the lateral end surfaces thereof.

Additional comments are hereunder made with regard to the specific processing (laser processing and heat treatment in particular). The aforementioned laser processing, blasting, ultrasonic cleaning, and heat treatment effectively prevent moisture from depositing on the lateral end surfaces of piezoelectric/electrostrictive elements 14 (in particular, the lateral end surfaces of the piezoelectric/electrostrictive layers 14b1 to 14b4, refer to FIG. 2). In the cases of the laser processing and the heat treatment in particular, surface modification (chemical affinity change) occurs simultaneously on the lateral end surfaces of the piezoelectric/electrostrictive elements 14 and thereby moisture is further prevented from depositing.

More specifically, a surface before subjected to laser processing or heat treatment (two lateral end surfaces of a pre-specific processing piezoelectric/electrostrictive device) is a cut plane (processed plane) and hence a hydroxyl group and a hydrogen group combine with a dangling bond on the surface. Therefore, water molecules tend to be bonded on the surface by hydrogen bond. In contrast, on the surface after subjected to laser processing or heat treatment (the lateral end surfaces of the piezoelectric/electrostrictive elements 14 in particular), bonds between dangling bonds occur due to the energy imposed on the surface (thermal energy for example).

As a result, the hydroxyl group and the hydrogen group which have bonded to the dangling bonds disappear and moisture becomes hardly combined at the lateral end surfaces of the piezoelectric/electrostrictive elements 14.

Further, as stated above, the surface before subjected to laser processing or heat treatment (two lateral end surfaces of a pre-specific processing piezoelectric/electrostrictive device) is a processed plane. Piezoelectric/electrostrictive layers comprise ceramics that are relatively likely to be processed and the electrodes comprise metal having ductility. Therefore, because of the difference in workability between the piezoelectric/electrostrictive layers and the electrodes on the processed plane, the electrodes tend to have a protruded shape and burrs tend to appear at the electrodes. Here, when the electrodes have a protruded shape, electrostatic focusing occurs and the withstand voltage of the piezoelectric/electrostrictive elements deteriorates. Further, when the burrs appear at the electrodes, the shortest distance between two electrodes interposing the piezoelectric/electrostrictive layers reduces and the withstand voltage of the piezoelectric/electrostrictive elements deteriorates. On the other hand, when laser processing or heat treatment is applied, the electrodes made of metal melt earlier than the piezoelectric/electrostrictive layers. The molten metal (electrodes) contracts in order to reduce the surface energy and forms a spherical shape. Thereby the protrusions of the electrodes reduce and the length of the burrs of the electrodes shortens. As a result, the number of places where electrostatic focusing occurs decreases and the shortest distance between the electrodes increases. As a consequence, the withstand voltage of the piezoelectric/electrostrictive elements improves.

Furthermore, as stated above, the surface before subjected to laser processing or heat treatment (two lateral end surfaces of a pre-specific processing piezoelectric/electrostrictive device) is a processed plane. Therefore, by the stress at the processing, the crystal structure distorts at the surfaces of the piezoelectric/electrostrictive layers and the piezoelectric characteristics of the piezoelectric/electrostrictive layers deteriorate. In contrast, when laser processing or heat treatment is applied, the restructure of atoms occurs by the thermal energy. As a result, the crystal structure is restructured and the piezoelectric characteristics of the piezoelectric/electrostrictive layers are restored.

In addition, cracks sometimes occur in the piezoelectric/electrostrictive layers by the load at the processing. However, when laser processing or heat treatment is applied, resintering occurs by the thermal energy and the effect of repairing the generated cracks is exhibited.

Meanwhile, as stated above, when a surface area increase rate Smag is tried to be measured and evaluated directly in order to clarify the effect of the specific processing on the reduction of the actual surface area Sact (namely, a surface area increase rate Smag) of the lateral end surfaces of piezoelectric/electrostrictive elements 14, a relatively expensive and precise apparatus such as a confocal scanning laser microscope, an atomic force microscope, or the like is required. To cope with the problem, the present inventors have studied repeatedly in order to find a means for conveniently evaluating an actual surface area Sact (namely, a surface area increase rate Smag) of the lateral end surfaces of piezoelectric/electrostrictive elements 14 at a lower cost.

As a result, the present inventors have found that an actual surface area Sact (namely, a surface area increase rate Smag) of the lateral end surfaces of piezoelectric/electrostrictive elements 14 has strong correlation with the degree of separation (the number N of separated particles) of fine particles (the separation of particles is hereunder referred to as "particle separation") from the lateral end surfaces.

Figure 11:
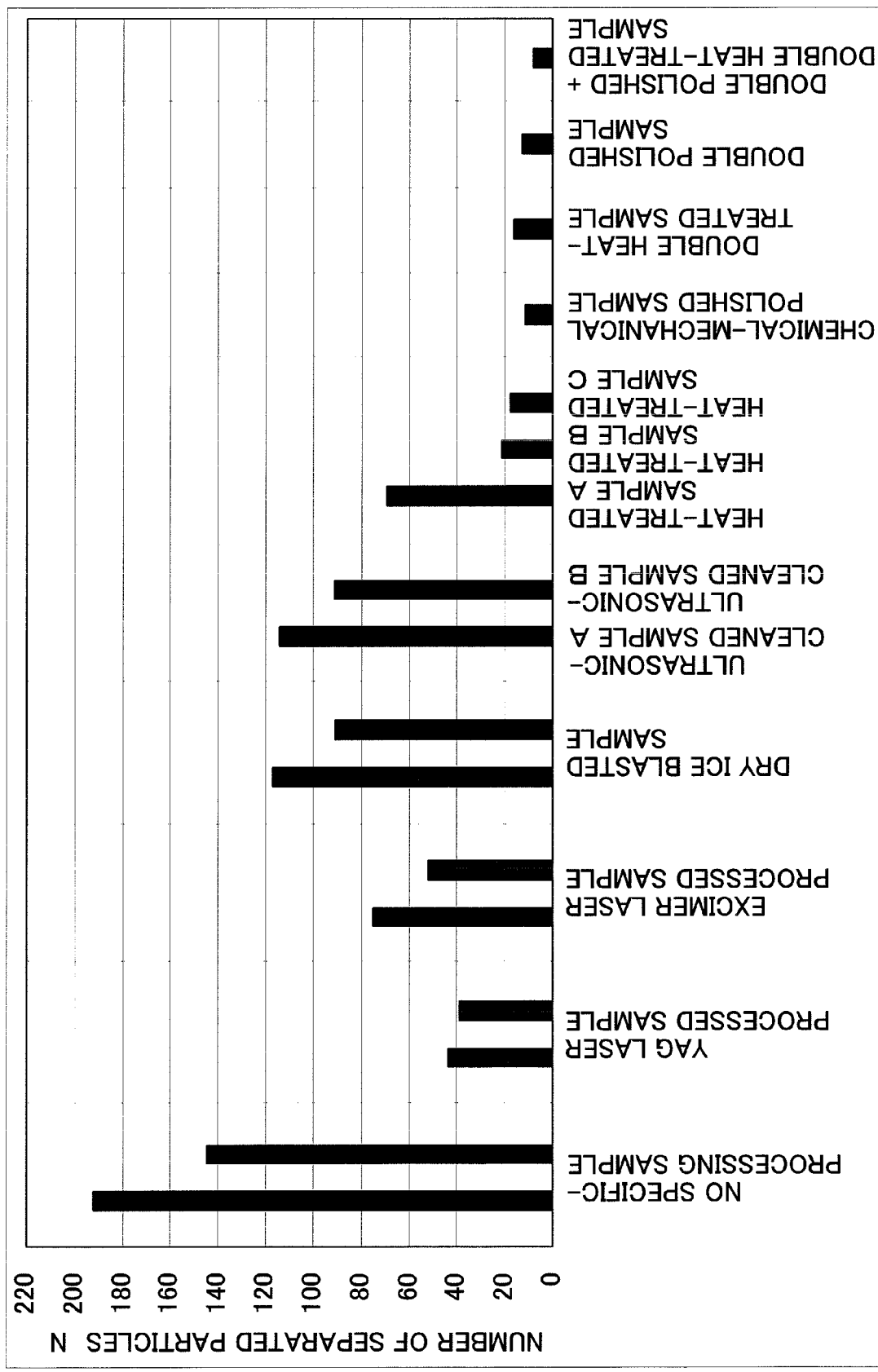
FIG. 11 is a graph showing the data on the number of particles separated from the lateral end surfaces of respective piezoelectric/electrostrictive elements with regard to respective test samples subjected to respective specific processing according to the present invention and a test sample before subjected to the specific processing.

Table 3 and FIG. 11 show the results of measuring the numbers N of the particles separated from the lateral end surfaces of piezoelectric/electrostrictive elements 14 respectively with regard to the same test samples as used when the data shown in Table 1 (namely FIG. 9) are measured.

TABLE 3

| No. | Test sample | | Remarks | N |
|---|---|---|---|---|
| 0 | No specific-processing sample | | Standard sample | 192 145 |
| 1 | YAG laser processed sample | | | 44 39 |
| 2 | Excimer laser processed sample | | | 75 52 |
| 3 | Dry ice blasted sample | | | 117 91 |
| 4 | Ultrasonic-cleaned sample | A B | #800 #1000 | 114 91 |
| 5 | Heat-treated sample | A B C | 800° C. 900° C. 1,000° C. | 69 21 18 |
| 6 | Chemical-mechanical polished sample | | | 12 |
| 7 | Double heat-treated sample | | | 16 |
| 8 | Double polished sample | | | 13 |
| 9 | Double polished + double heat-treated sample | | | 8 |

Such measurement of a number N of separated particles is carried out with a liquid particle counter (LPC) "KL-26" made by RION Co., Ltd. More specifically, each of test samples is put into a 1,000 ml beaker containing prescribed ultrapure water and subjected to ultrasonic cleaning. Thereby the particles separated from the test sample are dispersed in the ultrapure water. Then, the number of particles having grain diameters of 0.5 μm or more in the ultrapure water is measured with the LPC and thereby the number N of particles separated from the lateral end surfaces of the piezoelectric/electrostrictive elements 14 of the test sample is counted. Here, the fact that the separated particles dispersing in the ultrapure water are generated from the lateral end surfaces of the piezoelectric/electrostrictive elements 14 is confirmed by trapping the dispersing separated particles with a filter and analyzing the composition with an EDS (Energy Dispersive X-ray Spectrometer) "HORIBA XerophyS-298HXI" made by HORIBA, Ltd. Meanwhile, the area of the whole surface, exposed outside, of the piezoelectric/electrostrictive layers in the orthographic projection is 0.045 cm2 or less.

As it is understood from the results of the comparison between FIGS. 11 and 9, it may be said that the number N of the particles separated from the lateral end surfaces of piezoelectric/electrostrictive elements 14 nearly agrees with the surface area increase rate Smag (namely actual surface area Sact) of the lateral end surfaces of the piezoelectric/electrostrictive elements 14 in terms of qualitative tendency. That is, in particular, when CMP, double polishing, or double polishing+double heat treatment is applied, a great effect on the prevention of particle separation has been obtained.

It is estimated that this result is based on the fact that, in general, as minute bumps and dips on a surface increase and the area of the surface increases, the minute bumps on the surface separate from the surface and thereby particles tend to separate.

As stated above, the number N of the particles separated from the lateral end surfaces of piezoelectric/electrostrictive elements 14 can easily be measured at a low cost by using a known LPC. Further, it has been found that the actual surface area Sact (namely the surface area increase rate Smag) of the lateral end surfaces of piezoelectric/electrostrictive elements 14 has strong correlation with the number N of the particles separated from the lateral end surfaces. Therefore, by measuring the number N of the particles separated from the lateral end surfaces of piezoelectric/electrostrictive elements 14, it is possible to easily evaluate (examine) the actual surface area Sact (namely the surface area increase rate Smag) of the lateral end surfaces of the piezoelectric/electrostrictive elements 14 at a low cost.

Further, in the process, the LPC confirms also the generation of debris, dust, and the like (the generation of debris, dust, and the like is hereunder referred to as "dust generation") from a piezoelectric/electrostrictive device 10. Here, dust generation must be avoided to the utmost in some service environment of a piezoelectric/electrostrictive device 10 (for example when the device is used as an actuator or the like for the positioning of a semiconductor manufacturing apparatus). From the above explanations, it is understood that, by applying specific processing according to the present invention, not only the effect on the reduction of the actual surface area Sact of the lateral end surfaces of piezoelectric/electrostrictive elements 14 but also the effect on the prevention of dust generation caused by the particle separation from the lateral end surfaces can be exhibited.

In the meantime, the plurality of electrodes 14a1 to 14a5 which are constituent elements of piezoelectric/electrostrictive elements 14 comprise, for example, metal such as platinum having glutinous ductility and the plurality of piezoelectric/electrostrictive layers 14b1 to 14b4 which are also constituent elements thereof comprise, for example, a piezoelectric ceramic material mainly composed of brittle (fragile) lead zirconate titanate (PZT) having relatively low strength. A brittle (fragile) material having relatively low strength has a high possibility that particle separation occurs. Therefore, it is said that the parts where particle separation is most likely to occur on the lateral end surfaces of piezoelectric/electrostrictive elements 14 are the lateral end surfaces of the piezoelectric/electrostrictive layers 14b1 to 14b4 comprising the piezoelectric ceramic material. In other words, it is considered that most of the number N of the separated particles is the number of the particles separated from the piezoelectric/electrostrictive layers 14b1 to 14b4.

As it has been explained above, piezoelectric/electrostrictive devices according to the present invention can be used not only as various kinds of transducers, various kinds of actuators, frequency domain functional parts (filters), transformers, active elements such as the oscillators and radiators for communication and power generation, and discriminators but also as sensor elements for various kinds of sensors such as ultrasonic sensors, acceleration sensors, angular velocity sensors, impact sensors, and mass sensors. Further, the piezoelectric/electrostrictive devices are used as various kinds of actuators used for the mechanisms of the adjustment of displacement and positioning and the adjustment of angles of various precise parts and the like of optical instruments, precision instruments, and the like.

Further, in the case of such a piezoelectric/electrostrictive device, the ratio (the surface area increase rate Smag) of the actual surface area Sact of the lateral end surfaces of piezoelectric/electrostrictive elements 14 to the area Spro of the lateral end surfaces of the piezoelectric/electrostrictive elements 14 in the orthographic projection is controlled to "four" or less by applying specific processing to the lateral end surfaces (the cut planes) of the piezoelectric/electrostrictive elements 14 cut by mechanical processing (wire sawing). By so doing, the deposition of moisture on the lateral end surfaces of the piezoelectric/electrostrictive elements 14 can be suppressed to the extent of not substantially generating the aforementioned electric leakage and ion migration and, as a result, the prescribed operation of the piezoelectric/electrostrictive device is maintained for a long period of time. In other words, a highly durable piezoelectric/electrostrictive device can be provided. In addition, a piezoelectric/electrostrictive device that can be used in a circumference wherein dust generation should be avoided to the utmost can be provided.

The present invention is not limited to the aforementioned embodiments and can take various modifications within the scope of the present invention. For example, as the laser processing in the specific processing, YAG laser processing and excimer laser processing are named in the above embodiments but other laser processing such as plasma usher, reverse sputter, or the like may be adopted as the specific processing.

Further, in the above embodiments, as blasting in the specific processing, dry ice blasting is named but other blasting such as blasting of ceramic particles comprising SiC, SiO2, ZrO2, Al2O3, or the like, organic particles comprising polyethylene (PET) or the like, metallic particles Al or the like, or liquid CO2 may be adopted as the specific processing.

Furthermore, in the above embodiments, in the ultrasonic cleaning as the specific processing, Al2O3 or SiC (ceramic particles) is used as abrasive grains. However, other ceramic particles comprising SiO2, ZrO2, or the like, organic particles comprising polyethylene (PET) or the like, or metallic particles comprising Al or the like may be used as the abrasive grains.

Furthermore, in the above embodiments, in the heat treatment as the specific processing, although an atmosphere furnace is used, a furnace of oxygen or nitrogen atmosphere or a vacuum furnace may be used.

Furthermore, in the above embodiments, although each of piezoelectric/electrostrictive elements 14 is provided with a plurality of electrodes 14a1 to 14a5 and a plurality of piezoelectric/electrostrictive layers 14b1 to 14b4, a piezoelectric/electrostrictive element 14 may be configured so as to be provided with a pair of electrodes and single piezoelectric/electrostrictive layer interposed between the paired electrodes.

Furthermore, when the stationary portion 11, the thin-plate portions 12, and the holding portions 13 are composed of metal, in place of the ceramic laminate 23 shown in FIG. 6, a metallic structure having the same shape as the ceramic laminate may be formed by casting. Otherwise, it is also possible to prepare thin-plate metals of the same shapes as the ceramic green sheets shown in FIG. 4 and to form a metallic structure having the same shape as the ceramic laminate 23 by bonding the thin-plate metals (diffusion bonding) through cladding. Further, the stationary portion 11, the thin-plate portions 12, and the holding portions 13 may be composed by bending metal bars having the rectangular cut planes into U-shapes.

Additionally, in the above embodiments, the total length (the length from the ends of the holding portions 13 to the end of the stationary portion 11) of a piezoelectric/electrostrictive device 10 is determined through the cutting (dicing) of an incinerated piece (ceramic laminate 23) shown in FIG. 6 but may be determined at the processing of the ceramic green sheets 21a to 21f shown in FIG. 4. More specifically, the open windows having planes corresponding to the end surfaces of the holding portions 13 as parts of the inner wall surfaces and the open windows having a plane corresponding to the end surface of the stationary portion 11 as a part of the inner wall surface may be formed in the ceramic green sheets 21a to 21f. By so doing, it is possible to make the total lengths of the piezoelectric/electrostrictive devices 10 more uniform (the whole lengths are determined with a high degree of accuracy) than the case where a thick incinerated piece is cut.

Further, an object is held between a pair of holding portions 13 in a piezoelectric/electrostrictive device 10 according to the aforementioned embodiments but may be held while spacers (not shown in the figure) attached with an adhesive are interposed between the paired holding portions 13. Further, it is also possible to hold an object with an adhesive on the sides of the lateral surfaces (on the sides of the front surface and the rear surface in FIG. 1) of the holding portions of a piezoelectric/electrostrictive device according to the aforementioned embodiments.

Figure 12:
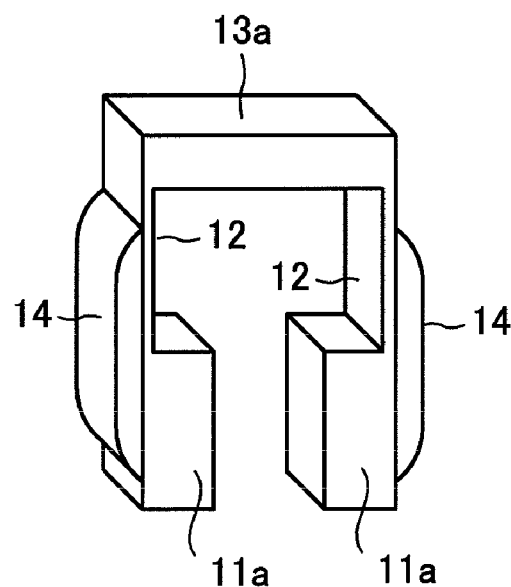
FIG. 12 is a perspective view showing yet another modification of the piezoelectric/electrostrictive device of FIG. 1.
Figure 13:
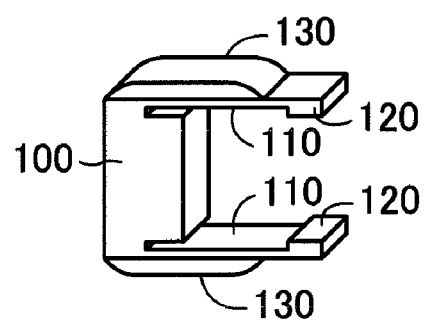
FIG. 13 is a perspective view showing a conventional piezoelectric/electrostrictive device.
Figure 14:
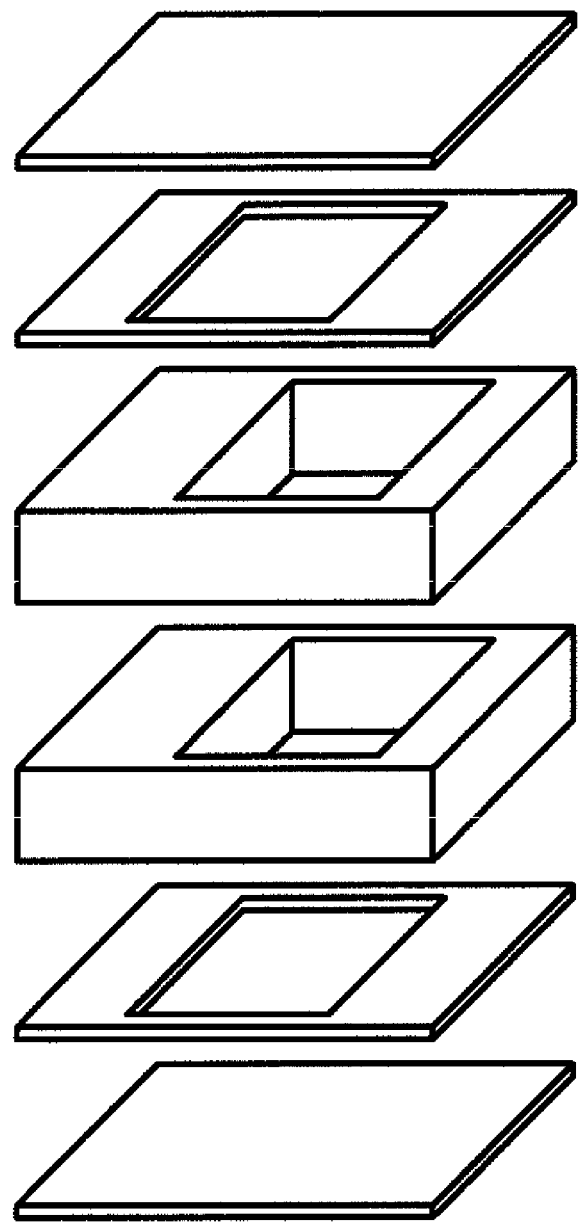
FIG. 14 is a perspective view showing ceramic green sheets to be laminated in the process of manufacturing the piezoelectric/electrostrictive device of FIG. 13.
Figure 15:
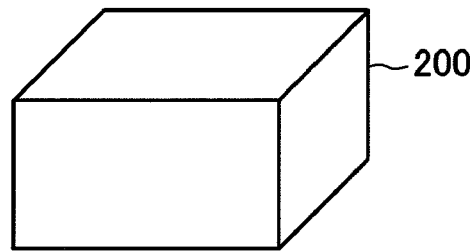
FIG. 15 is a perspective view showing a ceramic laminate formed by monolithically firing a ceramic green sheet laminate formed by laminating and compression-bonding the ceramic green sheets of FIG. 14.
Figure 16:
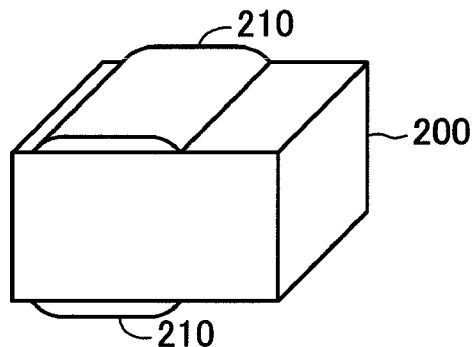
FIG. 16 is a perspective view showing the ceramic laminate of FIG. 15 on which piezoelectric/electrostrictive laminates are formed.
Figure 17:
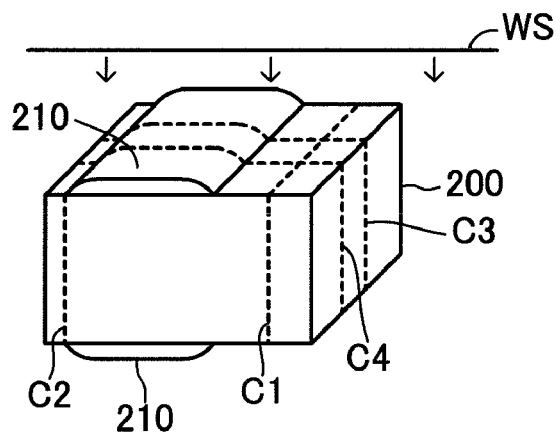
FIG. 17 illustrates a step of cutting the ceramic laminate and the piezoelectric/electrostrictive laminates shown in FIG. 16.

Furthermore, as shown in FIG. 12, a piezoelectric/electrostrictive device may be configured so that each stationary portion may hold each thin-plate portion by cutting off the center portion of the stationary portion 11 in the aforementioned embodiments and thus forming a pair of stationary portions 11a and also the holding portion 13a may be formed with the portions integrally connecting the tip portions of the paired thin-plate portions 12.

Remarks are added with regard to the aforementioned No. 6: CMP. When CMP is applied, the number of particles 0.5 µm or more in particle diameter that is the evaluation value of the LPC has been not more than half of the number thereof in the case of a test sample being processed with slurry of diamond 1 µm in average particle diameter and a tin polishing plate. Such an effect can be obtained even when subsequent heat treatment is not applied. In addition, such an effect can be obtained without the application of the aforementioned R forming. By using this method, a highly reliable piezoelectric/electrostrictive device causing a smaller amount of particles to generate can be realized. Further, by applying heat treatment for one hour at 650° C. in the air, the number of particles 0.5 µm or more in particle diameter that is the evaluation value of the LPC has been reduced to not more than half.

It is also possible to combine the method further with another method such as heat treatment. CMP is very effective even in the case where a method of removing processing strain on a surface by raising temperature in heat treatment or the like cannot be adopted, since the surface strain caused by processing prior to polishing can be removed chemically and the mechanochemical polishing itself does not generate strain.

The method of applying lapping with a polishing plate prior to polishing and thus adjusting the height of the surface of the device attached to a master plate is effective since the polishing time can be reduced. In the case, as the polishing plate, a polishing plate made of tin, copper, or a compound thereof, or ceramic polishing plate may be used but, when a resin polishing plate (a plastic plate) is used, a polishing object can be finished with fewer cracks and chips.

In the case of polishing with polishing cloth too, it is possible to obtain a processed surface with no cracks and chips at the processed end surfaces by firstly processing with soft polishing cloth, thus rounding the edges, and finally finishing the whole surface with hard cloth.

Such processing may be combined. Further, it is possible to reduce the amount of processing strain remaining on a surface by reducing the particle diameter of abrasive grains as the processing advances.

A piezoelectric/electrostrictive device having a higher degree of flatness is realized by applying mechanochemical polishing with colloidal silica or the like after such processing is applied.

The feature of the shape of a piezoelectric/electrostrictive device to which mechanochemical polishing is applied is that a step caused by the difference of chemical polishing is formed between Pt as the electrode material and the piezoelectric/electrostrictive layers. In the above embodiment, a step wherein Pt is higher by about 2 μm has been confirmed.

Remarks are added with regard to the aforementioned No. 8: Double polishing. In the case of double polishing, when curved surface forming is applied in order to applying R forming to the corners of the lateral end surfaces of piezoelectric/electrostrictive elements in the first polishing (the first polishing process), it is preferable that a curved surface comprises a curved surface having a curvature radius of 2 to 200 μm. Further, when chamfering is applied in order to applying R forming to the corners of the lateral end surfaces of piezoelectric/electrostrictive elements, it is preferable that the length of the chamfering at the edge of each corner is 2 to 200 μm.

In such a case, at the polishing in the aforementioned first and second polishing processes, polishing cloth is preferably used. Furthermore in the case, it is preferable that the polishing cloth used in the first polishing process is softer than the polishing cloth used in the second polishing process.

As stated above, in the case where the lateral end surfaces of piezoelectric/electrostrictive elements (the lateral end surfaces of a piezoelectric/electrostrictive device) are polished, by not using a hard polishing plate but using polishing cloth, it is possible to reduce the residual stress particularly at the corners where stress tends to concentrate. In addition, it is also possible to reduce residual stress on the planar portions (surfaces) of the lateral end surfaces of a piezoelectric/electrostrictive material. As a result, particle separation from the lateral end surfaces of piezoelectric/electrostrictive elements could be reduced.

Further, in comparison with the case of polishing the planar portions of the lateral end surfaces of piezoelectric/electrostrictive elements and thereafter applying R forming to the corners of the lateral end surfaces, smooth lateral end surfaces having less chips could be obtained without difficulty. Further, by so doing, impact concentration to the corners could be avoided when impact was imposed at handling and as a result an easy-to-use and highly reliable piezoelectric/electrostrictive device could be obtained.

Further, by not using a hard polishing plate but using polishing cloth in the polishing after R forming, the particle separation from the lateral end surfaces (processed planes) of piezoelectric/electrostrictive elements could be suppressed.

In addition, in the case where heat treatment was applied in order to alleviate the residual stress on the processed planes of piezoelectric/electrostrictive elements (a piezoelectric/electrostrictive device), even though the heat treatment temperature was set at not a generally employed high temperature of 800° C. but a relatively low temperature of about 650° C., an excellent particle separation prevention effect could be exhibited. As a result, even when a terminal material is not limited to a material withstanding high temperature heat treatment, a piezoelectric/electrostrictive device could be configured.

Remarks are added with regard to the aforementioned No. 9: Double polishing+double heat treatment (600° C.). By the processing, the number of the separated particles is reduced to about half of the number of the separated particles in the case of applying double polishing and then single heat treatment. The mechanism wherein the particle separation from the pores of piezoelectric/electrostrictive elements is suppressed is estimated to be as follows. That is, in processing (polishing process), abrasive grains, substances removed during processing, and the like enter and exit from the pores of the piezoelectric/electrostrictive elements and as a result strain is imposed on the interior of the pores due to the pressure of polishing and the like. In addition, foreign matters not removed by cleaning remain in the pores.

Then in the subsequent first heat treatment, strain relief by solid phase reaction is hindered by the strain caused by the residues. For that reason, by further applying second heat treatment after cleaning is applied after the first heat treatment and the residues in the pores are removed, it is possible to suppress the generation of particles from the pores.

Here, in the aforementioned No. 9: Double polishing+double heat treatment (600° C.), it has been understood that the same particle separation prevention effect can be obtained by applying high temperature heat treatment (800° C. to 1,000° C.) once in place of double heat treatment (600° C.). An advantage of the case of applying high temperature heat treatment (800° C. to 1,000° C.) once after double polishing is that the number of processes reduces in comparison with the case of applying ordinary heat treatment (600° C.) twice after double polishing. In this case however, a disadvantage thereof is that a material suitable for the high temperature heat treatment must be used as the material of the electrodes of piezoelectric/electrostrictive elements. Here, since inorganic components in deposits remain as ash even after the high temperature heat treatment in the same way as ordinary heat treatment, it is necessary to remove ash by applying cleaning again even after the high temperature heat treatment.

Meanwhile, it is preferable that the method for polishing a ceramic complex formed by arranging soft ceramics at the periphery of a plane includes a first polishing process of polishing only the periphery of the plane of the ceramic complex by first polishing and a second polishing process of subsequently polishing the inner part of the plane of the ceramic complex by second polishing that is different from the first polishing.

In general, when the periphery and the inner part of a plane of a ceramic complex formed by disposing soft ceramics at the periphery of the plane are polished simultaneously, damages such as chips tend to appear at the periphery. To cope with that, it has been found that the damages at the periphery of the ceramic complex can be prevented by firstly polishing only the periphery of the plane of the ceramic complex by first polishing and secondly polishing the inner part of the plane of the ceramic complex by second polishing that is different from the first polishing as stated above.

Figure 18A:
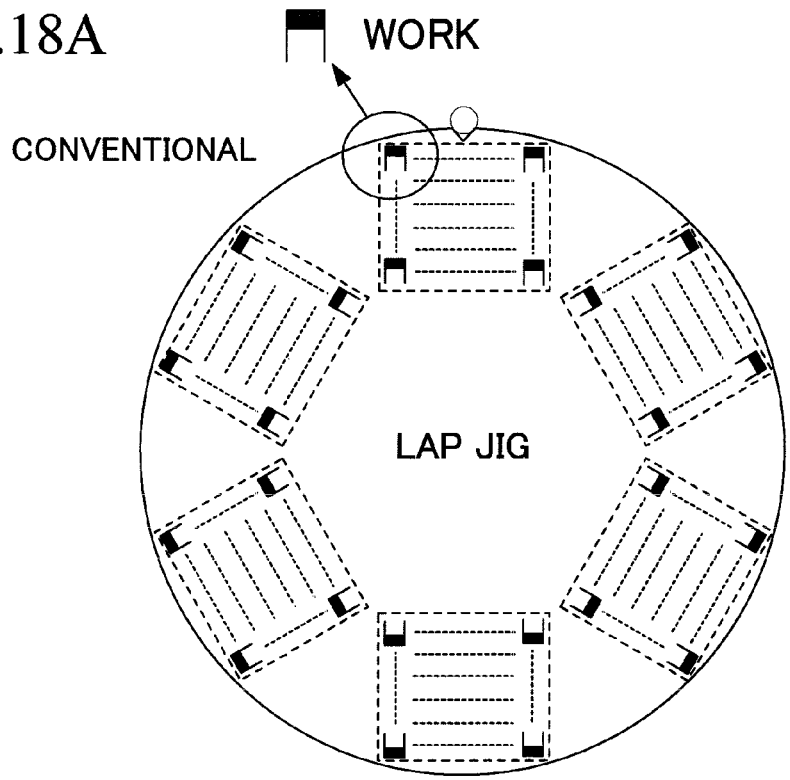
FIG. 18A is a view showing the orientation of the attachment of works on a round lap jig in a conventional case.
Figure 18B:
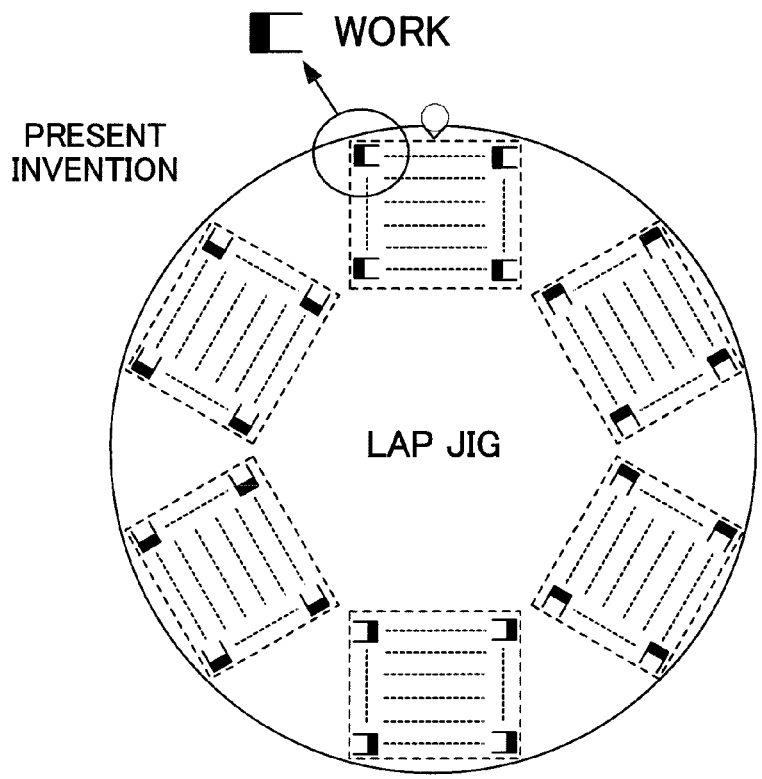
FIG. 18B is a view showing the orientation of the attachment of works on a round lap jig according to the present invention.

Further, in a method for polishing a ceramic member by attaching the ceramic member having a soft material at the periphery and having a shape bilaterally symmetrical to a reference line onto a round lap jig and relatively rotating the round lap jig on a round polishing machine, it is preferable that, when the ceramic member is attached onto the round lap jig, the ceramic member is attached onto the round lap jig so that the reference line for the symmetry of the ceramic member may be directed to the circumferential direction of the round lap jig (refer to FIG. 18B).

It has been found that, thereby, the R shapes on the right and left of the polished ceramic member (work) are more uniform than the case where the ceramic member is adhered onto the round lap jig so that the bilateral reference line of the ceramic member may be directed to the direction perpendicular to the circumferential direction (namely the radial direction) of the round lap jig (refer to FIG. 18A).

The invention claimed is:

1. A piezoelectric/electrostrictive device, comprising:
a thin-plate portion;
a stationary portion that supports the thin-plate portion; and
a piezoelectric/electrostrictive element which is formed by laminating a plurality of electrodes and at least one piezoelectric/electrostrictive layer at least on a plane of the thin-plate portion and has a lateral end surface formed with the respective lateral end surfaces of the plurality of electrodes and the lateral end surface of the at least one piezoelectric/electrostrictive layer, the device being formed by applying curved surface forming and/or chamfering to a corner of the lateral end surface of the piezoelectric/electrostrictive element; and having the surface roughness of a planar portion of the lateral end surface of the piezoelectric/electrostrictive element finished into 1 μm or less in terms of Ra by polishing, wherein the subsequent heating process is repeatedly applied twice or more.

2. The piezoelectric/electrostrictive device according to claim 1, wherein the heating process repeated twice or more is applied in a temperature range of 600° C. or lower.

3. A piezoelectric/electrostrictive device, comprising:

a thin-plate portion;

a stationary portion that supports the thin-plate portion; and a piezoelectric/electrostrictive element which is formed by laminating a plurality of electrodes and at least one piezoelectric/electrostrictive layer at least on a plane of the thin-plate portion and has a lateral end surface formed with the respective lateral end surfaces of the plurality of electrodes and the lateral end surface of the at least one piezoelectric/electrostrictive layer, the device being formed by applying curved surface forming and/or chamfering to a corner of the lateral end surface of the piezoelectric/electrostrictive element; and having the surface roughness of a planar portion of the lateral end surface of the piezoelectric/electrostrictive element finished into 1 μm or less in terms of Ra by polishing, wherein the subsequent heating process is applied in the temperature range of 800° C. to 1,000° C.

* * * * *